(12) United States Patent
Lee et al.

(10) Patent No.: US 9,141,751 B2
(45) Date of Patent: *Sep. 22, 2015

(54) METHOD OF FORMING A PATTERN

(71) Applicant: SAMSUNG ELECTRONICS CO., LTD., Suwon-si, Gyeonggi-do (KR)

(72) Inventors: Hyun-Jong Lee, Hwaseong-si (KR); Soo-Han Choi, Seoul (KR); Jung-Ho Do, Yongin-si (KR); Chul-Hong Park, Seongnam-si (KR); Sang-Pil Sim, Seongnam-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 159 days.

This patent is subject to a terminal disclaimer.

(21) Appl. No.: 13/950,799

(22) Filed: Jul. 25, 2013

(65) Prior Publication Data

US 2014/0162460 A1 Jun. 12, 2014

(30) Foreign Application Priority Data

Aug. 31, 2012 (KR) .................. 10-2012-0096707

(51) Int. Cl.
*G06F 17/50* (2006.01)
*H01L 21/308* (2006.01)

(52) U.S. Cl.
CPC ........ *G06F 17/5081* (2013.01); *H01L 21/3086* (2013.01)

(58) Field of Classification Search
CPC .................. G06F 17/5081; H01L 21/3086
USPC .................... 716/50–56; 430/5, 30
See application file for complete search history.

(56) References Cited

U.S. PATENT DOCUMENTS

| | | | |
|---|---|---|---|
| 5,900,349 A * | 5/1999 | Han | 430/311 |
| 7,579,278 B2 | 8/2009 | Sandhu | |
| 7,611,980 B2 | 11/2009 | Wells et al. | |
| 7,776,744 B2 | 8/2010 | Sandhu et al. | |
| 7,856,613 B1 * | 12/2010 | Weling et al. | 716/55 |
| 7,923,373 B2 | 4/2011 | Sandhu | |
| 7,941,782 B2 * | 5/2011 | Kai et al. | 716/139 |
| 7,977,242 B2 | 7/2011 | Sadjadi et al. | |
| 7,989,354 B2 | 8/2011 | Nakajima et al. | |
| 8,105,901 B2 | 1/2012 | Cheng et al. | |
| 8,440,569 B2 * | 5/2013 | Weling et al. | 438/717 |
| 8,647,893 B1 * | 2/2014 | Agarwal et al. | 438/16 |
| 8,697,538 B1 * | 4/2014 | Chiang | 438/430 |
| 8,889,560 B2 * | 11/2014 | Chung et al. | 438/702 |
| 2003/0230234 A1 * | 12/2003 | Nam et al. | 117/97 |
| 2007/0031740 A1 * | 2/2007 | Chen et al. | 430/5 |
| 2007/0099431 A1 * | 5/2007 | Li | 438/735 |
| 2007/0261016 A1 * | 11/2007 | Sandhu et al. | 716/19 |
| 2009/0017631 A1 | 1/2009 | Bencher | |
| 2009/0125866 A1 | 5/2009 | Wang et al. | |
| 2010/0130016 A1 | 5/2010 | DeVilliers | |

* cited by examiner

*Primary Examiner* — Nha Nguyen
(74) *Attorney, Agent, or Firm* — F. Chau & Associates, LLC

(57) ABSTRACT

A method of forming a pattern includes defining a plurality of patterns, defining a plurality of pitch violating patterns that contact the plurality of patterns and correspond to regions between the patterns, classifying the plurality of pitch violating patterns into a first region and a second region that is adjacent to the first region, selecting one of the first region and the second region, and forming an initial pattern defined as the selected first or second region. The selecting includes performing at least one of i) selecting a region that contact dummy patterns, ii) selecting a region of a same kind as one region, and iii) selecting a region that contacts a concave part of an enclosure from the first region and the second region.

20 Claims, 32 Drawing Sheets

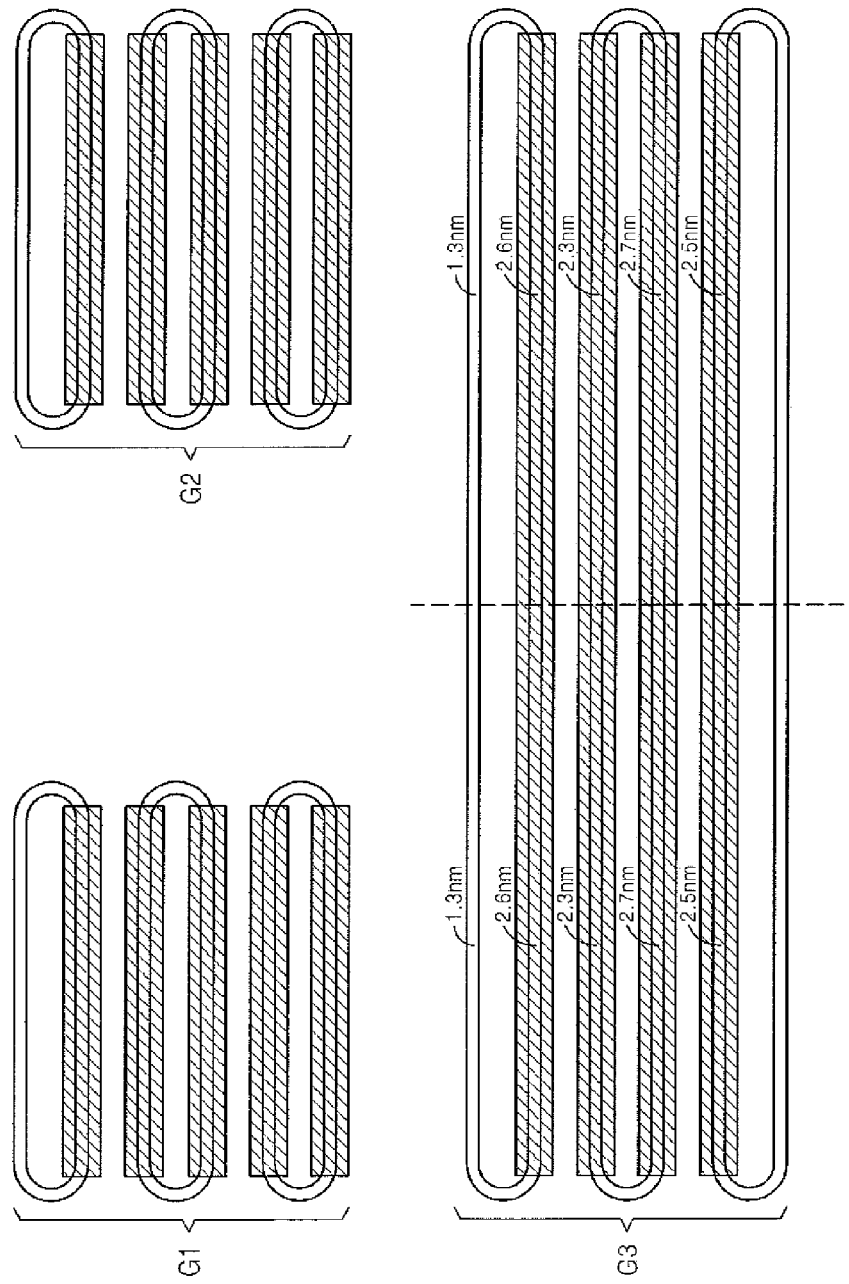

|  | DUMMY PROPERTY (5) | HOMOGENEOUS PROPERTY (5) | CONCAVE PROPERTY (5) | SUM |
|---|---|---|---|---|
| FIRST COLOR- A,C,E,G | 15 | 10 | 5 | 30 |
| SECOND COLOR- B,D,F |  | 10 |  | 10 |

METHOD OF FORMING A PATTERN

CROSS-REFERENCE TO RELATED APPLICATION

This application claims priority to Korean Patent Application No. 10-2012-0096707, filed on Aug. 31, 2012, the disclosure of which is hereby incorporated by reference herein in its entirety.

(i) Technical Field

Exemplary embodiments of the inventive concept relate to a method of forming a pattern, and more particularly, to a method of forming a fine pattern of a reticle or semiconductor device.

(ii) Discussion of The Related Art

Double patterning is a technique for forming a pattern having a pitch less than an exposable minimum pitch of an exposure apparatus without changing the exposure apparatus.

SUMMARY

Exemplary embodiments of the inventive concept provide a method of forming a fine pattern such that a target pattern has a pitch less than an exposable minimum pitch of an exposure apparatus by applying a double patterning method to the target pattern having a random shape.

According to an exemplary embodiment of the inventive concept, there is provided a method of forming a pattern, the method including: defining a plurality of patterns, defining a plurality of pitch violating patterns that contact the plurality of patterns and correspond to regions between the patterns, classifying the plurality of pitch violating patterns into a first region and a second region that is adjacent to the first region, selecting one of the first region and the second region, and forming an initial pattern defined as the selected first or second region. The selecting includes performing at least one of i) selecting a region that contact dummy patterns, ii) selecting a region of a same kind as one region, and iii) selecting a region that contacts a concave part of an enclosure from the first region and the second region.

The classifying of the plurality of pitch violating patterns into the first region and the second region may include corresponding the plurality of pitch violating patterns to a plurality of virtual nodes.

The i) selecting a region that contacts dummy patterns may include searching for nodes having a dummy property from the virtual nodes. The ii) selecting a region of the same kind as one region may include searching for nodes having the same property from the virtual nodes. The iii) selecting a region that contacts a concave part of an enclosure from the first region and the second region may include searching for nodes having a concave property from the virtual nodes.

The initial pattern may include pitch violating patterns corresponding to nodes located at an outermost part of the virtual nodes. In addition, the initial pattern may include pitch violating patterns corresponding to nodes having the same property. Furthermore, the initial pattern may include pitch violating patterns corresponding to nodes having a concave property.

The classifying of the plurality of pitch violating patterns into the first region and the second region may include: wherein if an interval between the plurality of pitch violating patterns is less than a minimum pitch of an exposure apparatus, establishing connectivities in the virtual nodes corresponding to the pitch violating patterns, alternately assigning a first color and a second color to the virtual nodes based on the connectivities, and classifying pitch violating patterns corresponding to the virtual nodes having the first color into the first region and pitch violating patterns corresponding to the virtual nodes having the second color into the second region.

The plurality of patterns may include a plurality of target patterns and the dummy patterns, and the dummy patterns may include patterns disposed outside the plurality of target patterns. In addition, the enclosure may include boundaries of the plurality of patterns.

According to an exemplary embodiment of the inventive concept, there is provided a method of forming a pattern, the method including: defining a plurality of patterns, defining a plurality of pitch violating patterns that contact the plurality of patterns and correspond to regions between the patterns, corresponding the plurality of pitch violating patterns to a plurality of virtual nodes, in which if an interval between the plurality of pitch violating patterns is less than a minimum pitch of an exposure apparatus, establishing connectivities in the plurality of virtual nodes corresponding to the pitch violating patterns, selecting at least one of i) nodes having a dummy property, ii) nodes having a same property, and iii) nodes having a concave property from the virtual nodes, alternately assigning a first color and a second color to the virtual nodes based on the connectivities and assigning the first color to the selected virtual nodes, and forming pitch violating patterns corresponding to the virtual nodes having the first color as an initial pattern.

The initial pattern may include at least one of i) pitch violating patterns corresponding to nodes located at an outermost part of the virtual nodes, ii) pitch violating patterns corresponding to nodes having a same property, and iii) pitch violating patterns corresponding to nodes having a concave property.

The method may further include: forming a sacrificial pattern on a semiconductor substrate by using a first reticle including the initial pattern, forming a spacer that surrounds the sacrificial pattern, removing the sacrificial pattern; and removing a portion of the spacer by using a second reticle.

The second reticle may include a trimming pattern defined as a region of a side wall surrounding the pitch violating patterns, wherein the region excludes a portion of the side wall which overlaps the target pattern.

In accordance with an exemplary embodiment of the inventive concept, a method for forming a pattern is provided. The method includes forming a sacrificial pattern on a film using a first reticle including an initial pattern. The initial pattern includes a target pattern have a plurality of patterns, a plurality of pitch violating patterns that contact the plurality of patterns of the target pattern and correspond to areas between the patterns of the target pattern, and a plurality of nodes corresponding to the plurality of pitch violating patterns in a first region of the initial pattern, respectively, a dummy pattern contacting at least one of the pitch violating patterns, and a protrusion protruding from a portion of the target pattern in the first region.

In addition, the method further includes forming a spacer that surrounds the sacrificial pattern, removing the sacrificial pattern, removing a portion of the spacer that does not overlap with the target pattern by an exposure process using a second reticle including a trimming pattern, in which the trimming pattern of the second reticle includes a first portion overlapping the target pattern and a second portion which does not overlap with the target pattern and etching the film using a remaining portion of the spacer as an etch mask, thereby forming a fine pattern having substantially a same shape as the target pattern.

BRIEF DESCRIPTION OF THE DRAWINGS

Exemplary embodiments of the inventive concept can be more clearly understood from the following detailed description taken in conjunction with the accompanying drawings in which:

FIGS. 24A and 24B are diagrams for describing the technical effect of a method of forming a pattern according to an embodiment of the inventive concept;

DETAILED DESCRIPTION OF EXEMPLARY EMBODIMENTS

Figure 1:
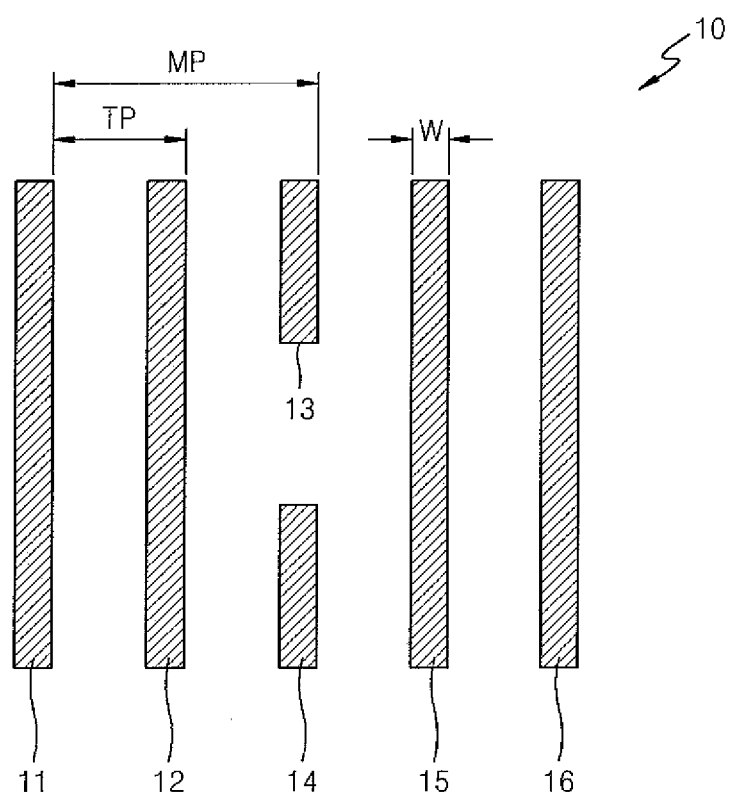
FIG. 1 is a plan view of a target pattern formed by using a method of forming a pattern according to an embodiment of the inventive concept.

Hereinafter, exemplary embodiments of the inventive concept will be described in detail with reference to the attached drawings.

Exemplary embodiments of the inventive concept may, however, be embodied in many different forms and should not be construed as being limited to those set forth herein.

The terms used herein are used to describe embodiments of the inventive concept, and not to limit exemplary embodiments of the inventive concept. A singular form may include a plural form, unless otherwise defined. The term "comprise" and/or "comprising" specify the existence of mentioned shapes, numbers, steps, operations, elements, parts, and/or groups thereof, and do not exclude existence or addition of at least one of other shapes, numbers, steps, operations, elements, parts, and/or groups thereof. As used herein, the term "and/or" includes any one of at least one of combinations of one or more of the associated listed items.

Hereinafter, exemplary embodiments of the inventive concept will be described more fully with reference to the accompanying drawings, in which exemplary embodiments of the invention are shown. In the drawings, the illustrated features may be changed due to, for example, the manufacturing technology and/or tolerance. Accordingly, it should be understood that the example embodiments of the inventive concept are not limited to the drawings but include modifications of the features of elements caused due to, for example, the manufacture.

FIG. 1 is a plan view of a target pattern 10 formed by using a method of forming a pattern according to an embodiment of the inventive concept.

Referring to FIG. 1, the target pattern 10 may have, for example, the same shape as that of an insulating or conductive pattern to be formed on a substrate. The target pattern 10 may include, for example, a first target pattern 11, a second target pattern 12, a third target pattern 13, a fourth target pattern 14, a fifth target pattern 15 and a sixth target pattern 16 and may have a pitch TP that is less than an exposable minimum pitch MP of an exposure apparatus.

FIGS. 2 through 12 are diagrams for describing a method of forming a pattern according to an embodiment of the inventive concept according to a processing order. The method of forming a pattern according to the current embodiment may be a method of forming a pattern on a reticle that is used in an exposure apparatus.

Figure 2:
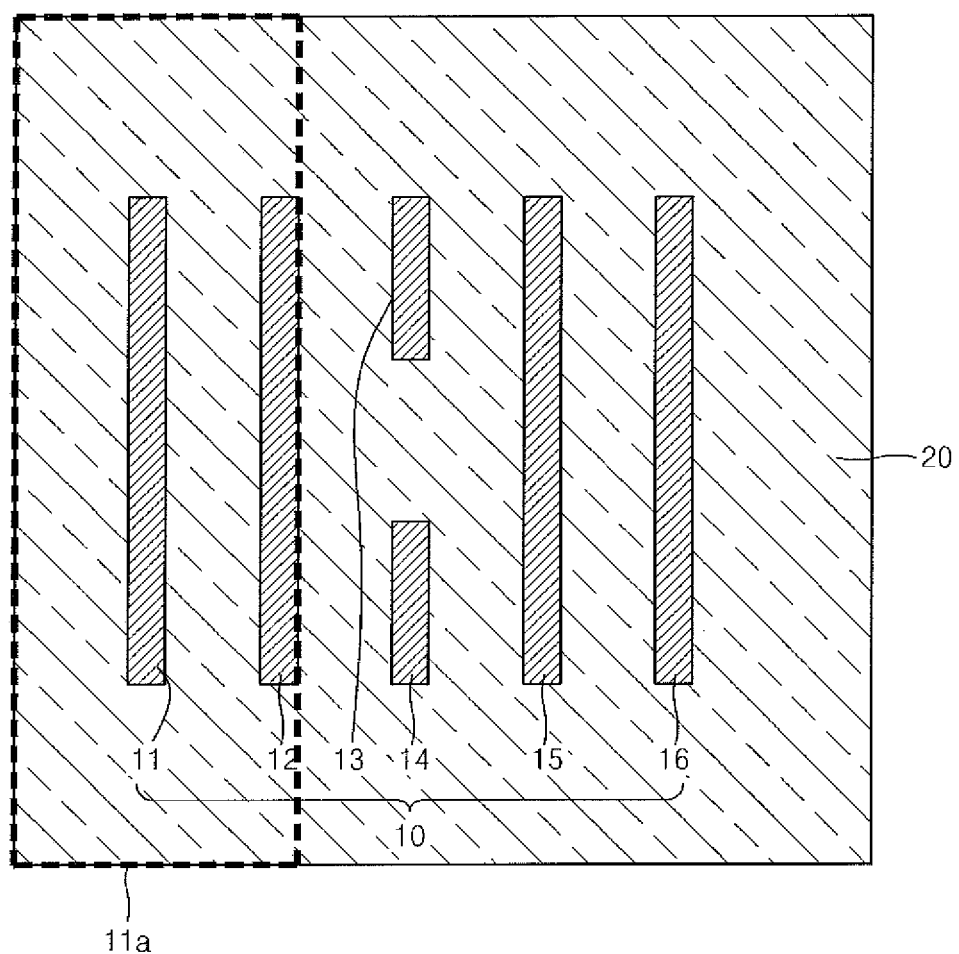
FIGS. 2 through 12 are diagrams for describing a method of forming a pattern according to an embodiment of the inventive concept according to a processing order.

Referring to FIG. 2, a boundary region 20 that surrounds the target pattern 10 is defined by expanding the target pattern 10 by a predetermined size. For example, the predetermined size may be obtained by subtracting a width W of the target pattern 10 from the minimum pitch MP. For example, the boundary region 20 may be defined by defining expanded regions (for example, a region 11a) by uniformly expanding each of the first to sixth target patterns 11 to 16 by a predetermined size and summing the expanded regions (for example, a sum), e.g., by performing an OR operation with respect to the expanded regions.

Figure 3:
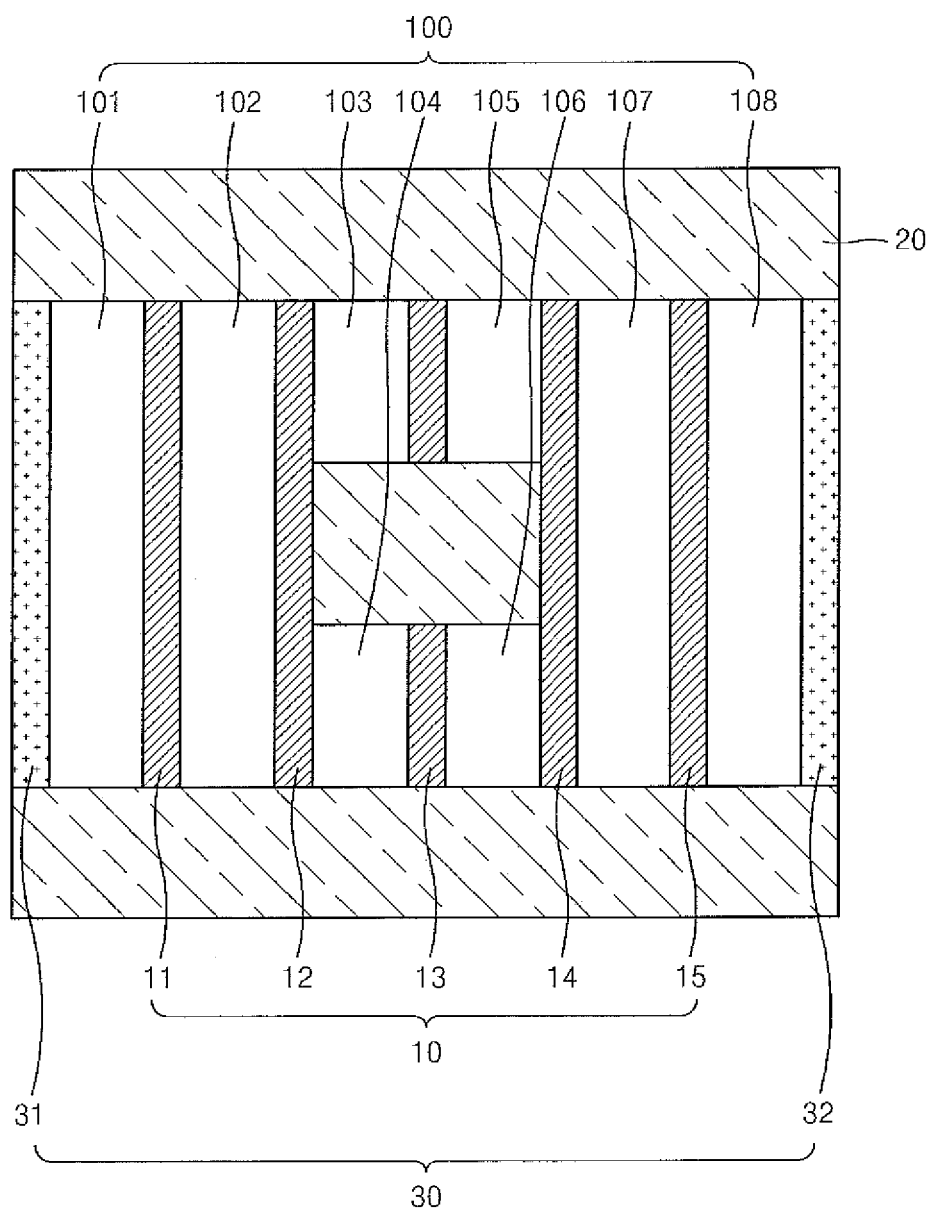

Referring to FIG. 3, a plurality of pitch violating patterns 100 including a first pitch violating pattern 101, a second pitch violating pattern 102, a third pitch violating pattern 103, a fourth pitch violating pattern 104, a fifth pitch violating pattern 105, a sixth pitch violating pattern 106, a seventh pitch violating pattern 107 and an eighth pitch violating pattern 108 are defined. The pitch violating patterns 100 may include, for example, a region having a pitch less than the minimum pitch MP of the exposure apparatus between parts of the target pattern 10 and a region having a pitch less than the minimum pitch MP of the exposure apparatus between the target pattern 10 and the boundary region 20. At least one surface of each pitch violating pattern 100 may, for example, contact the target pattern 10.

Then, a dummy pattern 30 is formed at portions where the pitch violating patterns 100 contact the boundary region 20. In FIG. 3, a first dummy pattern 31 is formed at a portion where the first pitch violating pattern 101 contacts the boundary region 20, and a second dummy pattern 32 is formed at a portion where the eighth pitch violating pattern 108 contacts the boundary region 20.

Figure 4:
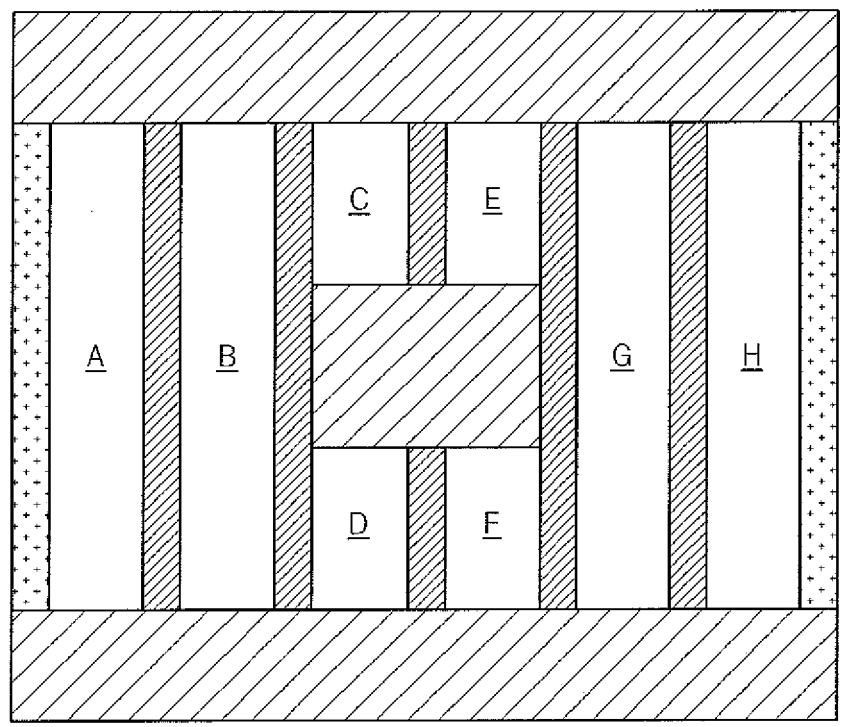

Referring to FIG. 4, the first to eighth pitch violating patterns 101 to 108 correspond to nodes (A, B, C, D, E, F, G, and H). For example, the first pitch violating pattern 101 corresponds to a node A, and the second to eighth pitch violating patterns 102 to 108 respectively correspond to nodes B to H.

Figure 5:
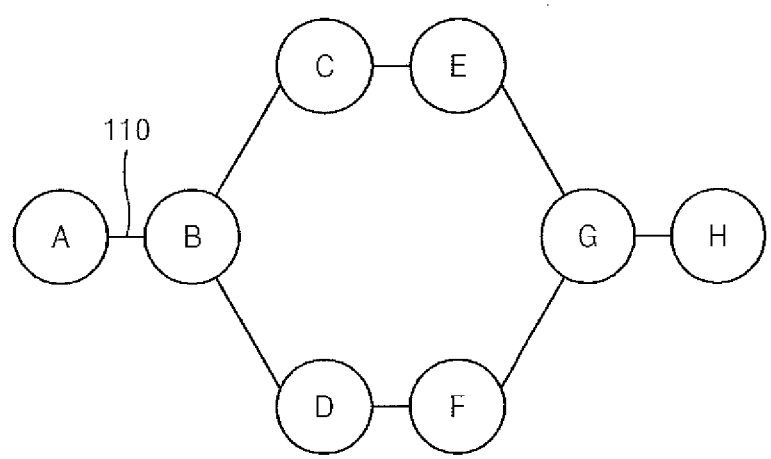

Then, referring to FIG. 5, if any interval between the first to eighth pitch violating patterns 101 to 108 is less than the minimum pitch MP of the exposure apparatus, a connectivity is established in nodes corresponding thereto. For example, as the interval between the first pitch violating pattern 101 corresponding to the node A and the second pitch violating pattern 102 corresponding to the node B is less than the minimum pitch MP, a connectivity 110 is established between the node A and the node B. Meanwhile, as the interval between the first pitch violating pattern 101 and one of the third pitch violating pattern 103 to the eighth pitch violating pattern 108 is greater than the minimum pitch MP, a connectivity is not established between the node A and one of the node C to the node H.

Figure 6:
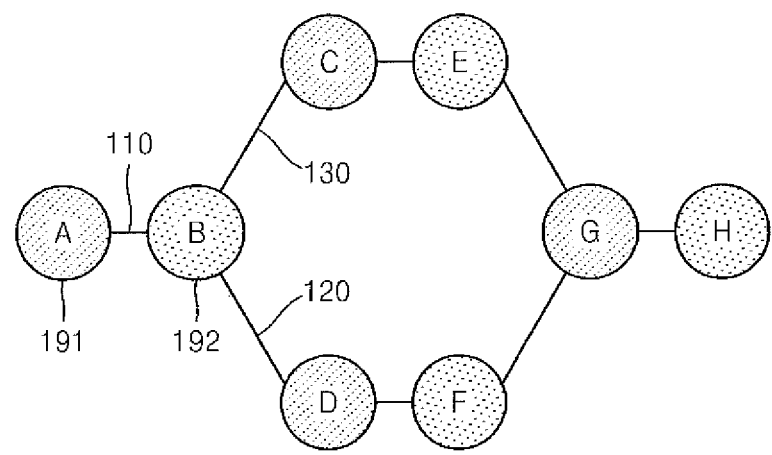

Referring to FIG. 6, a first color 191 and a second color 192 are alternately assigned to the nodes A to H based on the connectivities. For example, if the first color 191 is assigned to the node A, as the connectivity 110 is established between the node A and the node B, the second color 192 is assigned to the node B. As the second color 192 is assigned to the node B, and as connectivities 120 and 130 are respectively established between the node B and the node C and between the node B and the node D, the first color 191 is assigned to the nodes C and D.

The operation of alternately assigning two colors to the nodes A to H based on the connectivities may be performed using, for example, a graph coloring algorithm or a 2-coloring algorithm, which is known in the art. For example, the first color 191 may be assigned to the nodes A, C, D, and G, and the second color 192 may be assigned to the nodes B, E, F, and H.

Figure 7:
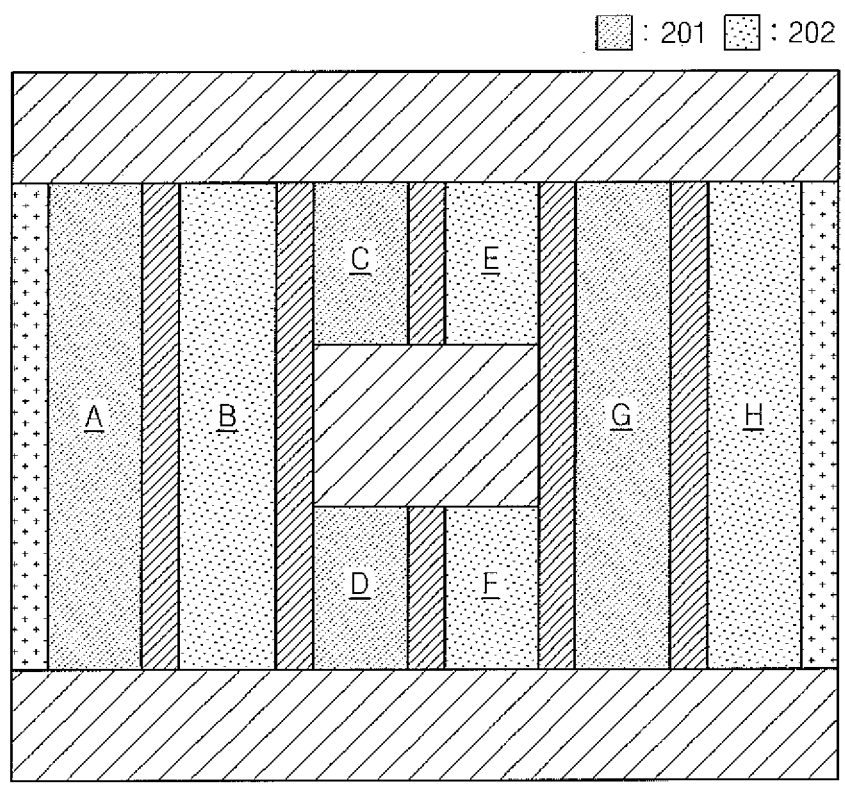

Referring to FIG. 7, the first to eighth pitch violating patterns 101 to 108 may be classified into, for example, a first region 201 and a second region 202. For example, the pitch violating patterns corresponding to the nodes having the first color 191 among the nodes A to H are regarded as the first region 201, and the pitch violating patterns corresponding to the nodes having the second color 192 among the nodes A to H are regarded as the second region 202.

For example, referring to FIGS. 3 and 7, the first, third, fourth, and seventh pitch violating patterns 101, 103, 104, and 107 corresponding to the nodes A, C, D, and G to which the first color 191 is assigned are regarded as the first region 201, and the second, fifth, sixth, and eighth pitch violating patterns 102, 105, 106, and 108 corresponding to the nodes B, E, F, and H to which the second color 192 is assigned are regarded as the second region 202.

Figure 8:
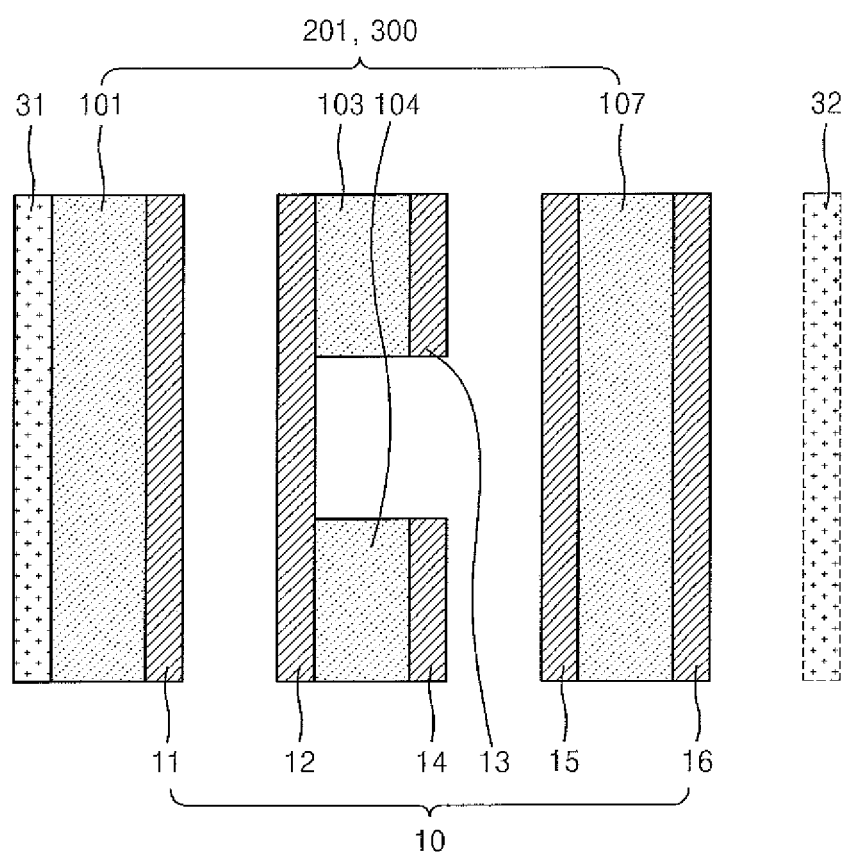

Referring to FIG. 8, one of the first region 201 and the second region 202 is defined as, for example, an initial pattern. A dummy pattern that does not contact the initial pattern is removed from the dummy pattern 30. For example, the first, third, fourth, and seventh pitch violating patterns 101, 103, 104, and 107 corresponding to the first region 201 may be defined as an initial pattern 300, and the second dummy pattern 32 of the dummy pattern 30, which does not contact the initial pattern 300, may be removed.

Figure 9A:
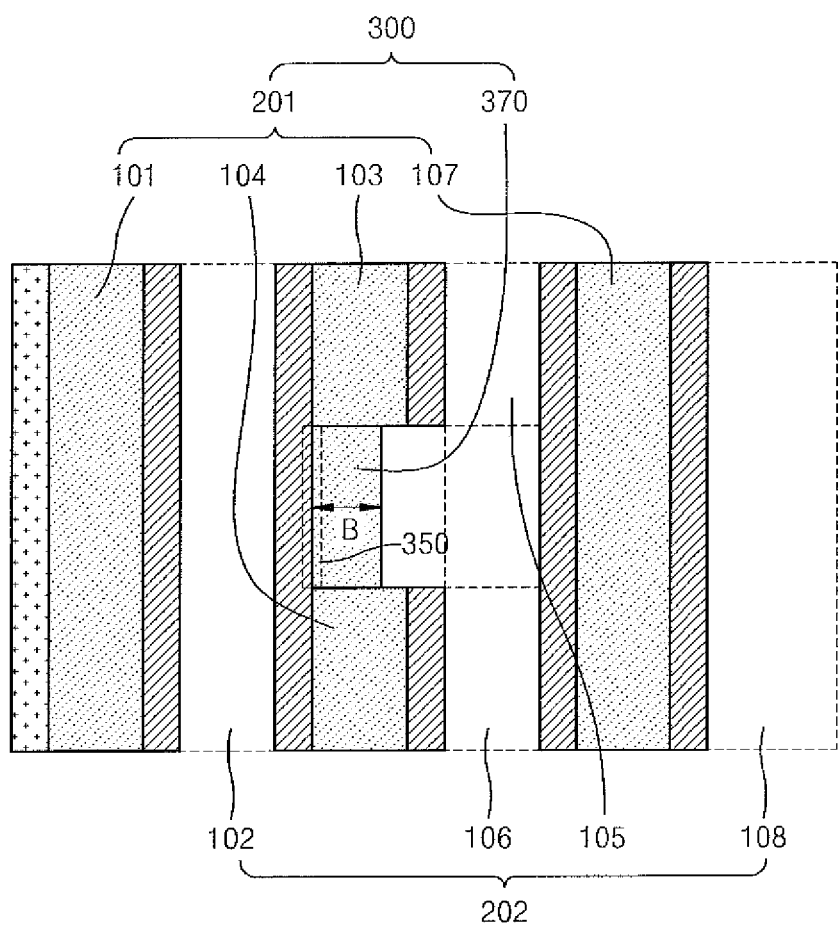

Referring to FIG. 9A, the initial pattern 300 may further include, for example, a protrusion 370 that protrudes from a portion 350 of the target pattern 10 that does not contact both of the first region 201 and the second region 202. The protrusion 370 protrudes, for example, from the portion 350 in a direction perpendicular to an extending direction of the target pattern 10 by a minimum bar size B.

In this regard, the minimum bar size B indicates a minimum width of a pattern that is to be exposed to light having a wavelength used for the exposure. The minimum bar size B may be determined by the type of light used during the exposure process and the type of a photoresist layer used to form the pattern. For example, the minimum bar size B may be ¼ to ½ of the minimum pitch MP of the exposure apparatus.

For example, the portion 350 contacts both of the third pitch violating pattern 103 and fourth pitch violating pattern 104, which belong to the first region 201, but the portion 350 does not contact the second pitch violating pattern 102, which belongs to the second region 202. In this regard, the initial pattern 300 may further include, for example, the protrusion 370 protruding from the portion 350 in a direction perpendicular to the extending direction of the target pattern 10 by the minimum bar size B.

Figure 9B:
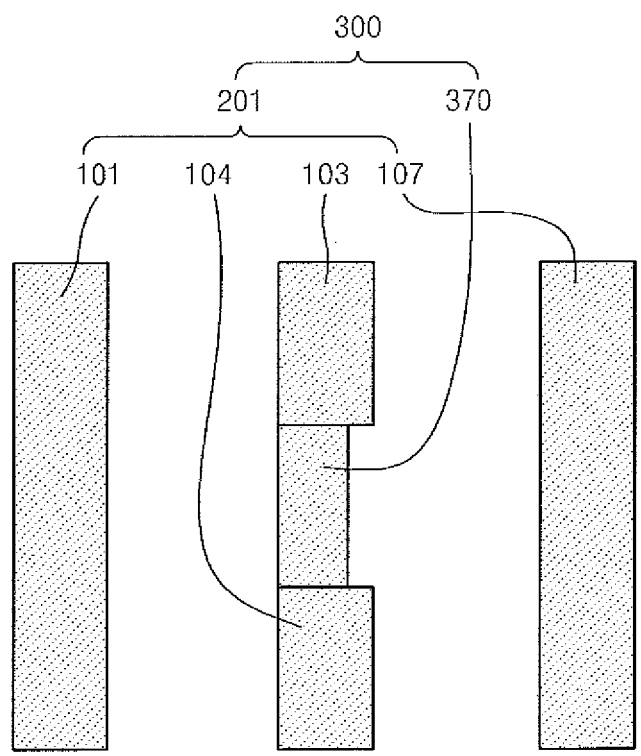

FIG. 9B illustrates the initial pattern 300 including the first region 201 and the protrusion 370. The initial pattern 300 may be used in, for example, a reticle for forming a sacrificial pattern on a film to be etched, which will be described later. For example, the sacrificial pattern corresponding to the initial pattern 300 may be formed on the film to be etched by, for example, an exposure process using the initial pattern 300 used in a reticle, and then a self-aligned double patterning process may be applied to the sacrificial pattern.

Figure 9C:
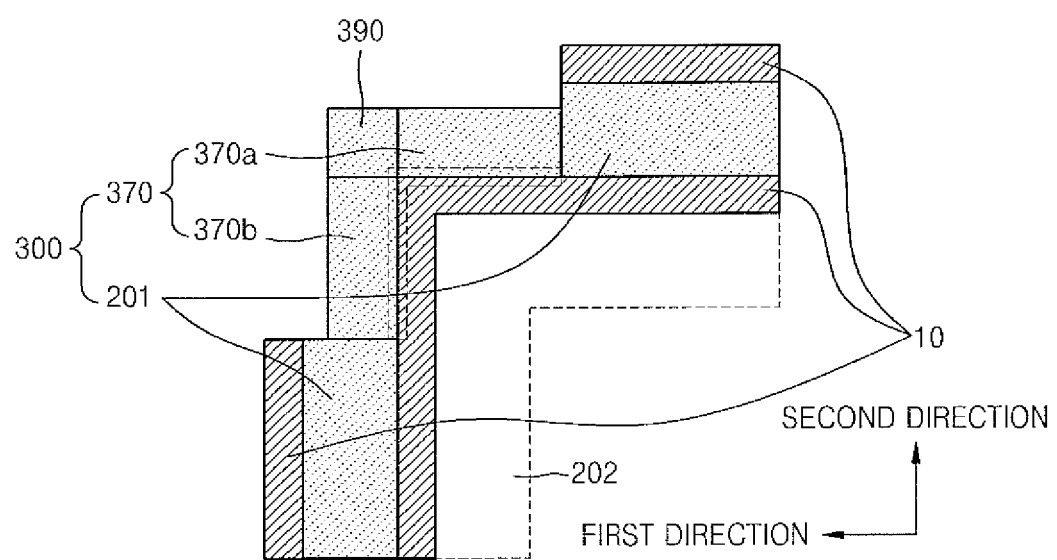

Referring to FIG. 9C, optionally, (there may be two or more protrusions 370 and) the initial pattern 300 may further include a corner 390 that fills a space between the protrusions 370 in addition to the protrusions 370 protruding from the portion 350 in directions perpendicular to the extending direction of the target pattern 10.

The corner 390 may be formed when the target pattern 10 extends in, for example, at least two directions. For example, if the target pattern 10 extends in a first direction and a second direction perpendicular to the first direction, the protrusions 370 may include a first protrusion 370a which may protrude in the second direction by the minimum bar size B, and a second protrusion 370b may protrude in the first direction perpendicular to the second direction by the minimum bar size B. In this regard, to connect the first protrusion 370a to the second protrusion 370b, the initial pattern 300 may include, for example, the corner 390 to fill a space between the first protrusion 370a and the second protrusion 370b.

As described above, the initial pattern 300 may include one of the first region 201 and the second region 202 (the first region 201 in FIG. 9C), the protrusion 370, and the corner 390. The initial pattern 300 may be implemented as, for example, a first reticle (not shown). The first reticle (not shown) including the initial pattern 300 may be used for an exposure process of, for example, a double patterning process to pattern a film to be etched. In this case, a sacrificial pattern may be formed on the film to be etched. This will be described in detail with reference to FIG. 13.

Figure 10:
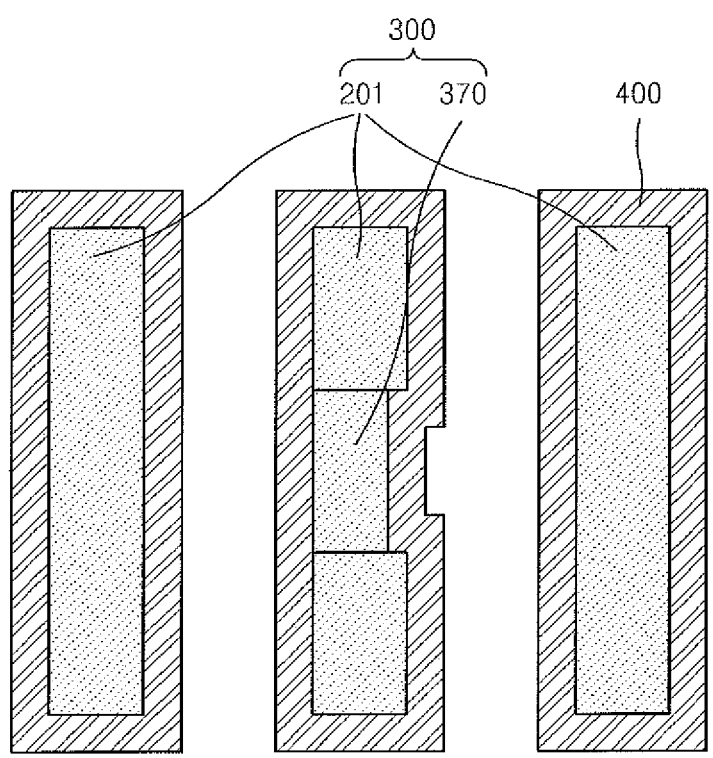

Referring to FIG. 10, a side wall 400 that surrounds the initial pattern 300 is formed. The side wall 400 corresponds to a spacer (880 of FIG. 30) formed on a film to be etched (820 of FIG. 30), and the spacer may serve as an etch mask for etching the film to be etched during a double patterning process. This will be described in detail later with reference to FIG. 30.

Figure 11:
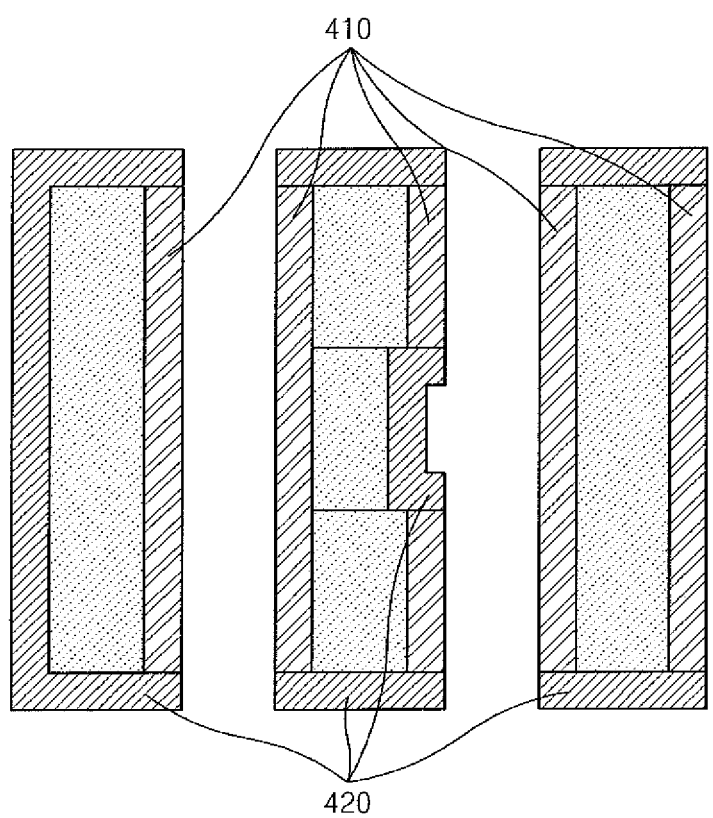

Referring to FIG. 11, in the side wall 400, a portion 410 overlapping with the target pattern 10 (FIG. 10) is distinguished from a portion 420 not overlapping with the target pattern 10. The portion 420 is for forming a trimming pattern. As described above, the side wall 400 corresponds to the spacer (not shown) as an etch mask for etching the film to be etched (not shown). Accordingly, the spacer should have, for example, a shape corresponding to the target pattern 10 (FIG. 1). For this, a portion of the spacer that does not overlap with the target pattern 10 (FIG. 1) should be removed.

Thus, for example, to remove the portion of the spacer that does not overlap with the target pattern 10 (FIG. 1), a second reticle (not shown) including a trimming pattern 430 defined as the portion 420 of the side wall 400 may be prepared. In this regard, an etch mask for etching the film to be etched may be prepared by, for example, removing the portion of the spacer that does not overlap with the target pattern 10 (FIG. 1) by an exposure process using the second reticle.

Figure 12:
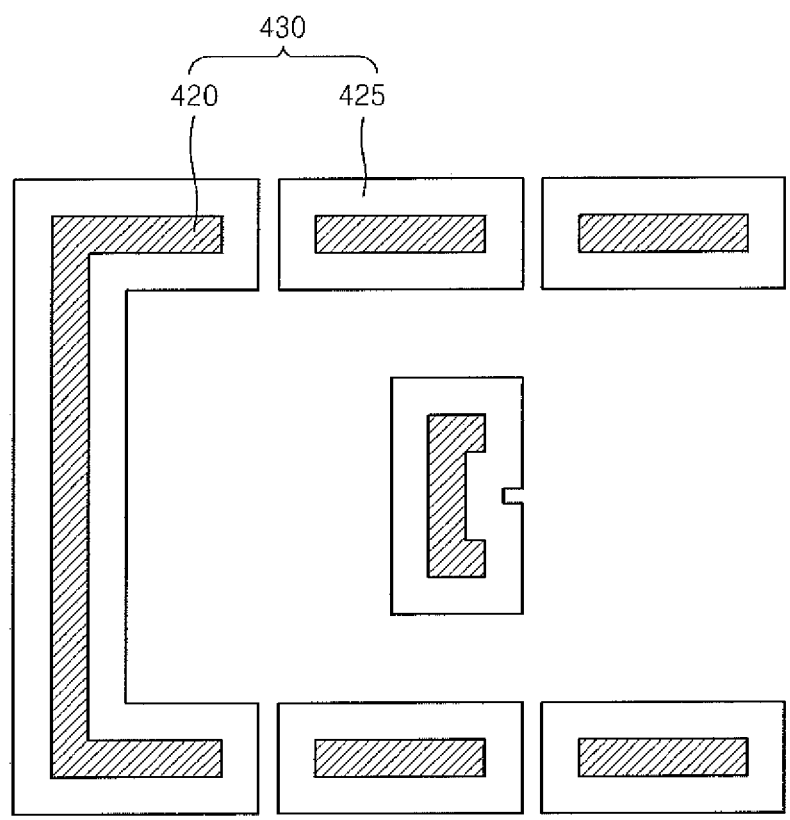

FIG. 12 illustrates the trimming pattern 430 of a second reticle 920 used for an exposure process. The trimming pattern 430 is defined as, for example, a region of the side wall 400 that excludes the portion 410 (FIG. 11) where the side wall 400 overlaps the target pattern 10.

Optionally, the trimming pattern 430 of the second reticle 920 may further include, for example, a correction unit 425 in addition to the portion 420 which does not overlap with the target pattern 10 to increase an overlay margin of the trimming pattern 430 and increase patterning performance. The correction unit 425 may be formed using, for example, a design rule check (DRC) or optical proximity correction (OPC) technique.

According to the method of forming a pattern described above with reference to FIGS. 2 through 12, the initial pattern 300 and the trimming pattern 430 may be formed. A double patterning process may be performed using, for example, the initial pattern 300 and the trimming pattern 430. For example, the initial pattern 300 and the trimming pattern 430 may be respectively formed on reticles (not shown) formed in an exposure apparatus, and a fine pattern may be formed on a semiconductor substrate using the reticles. This will be described in detail later with reference FIG. 13.

A double patterning process may be applied to, for example, a flash cell having a simple pattern, in which, for example, patterns of a line-and-space shape are repeated, since a space may be decomposed by manually forming a trimming pattern. However, it may be difficult to apply the double patterning process to a complicated pattern such as a circuit pattern of a peripheral region in which discrete or bent lines are formed, as such manual decomposition may not be possible. However, the trimming pattern 430 may be automatically formed by the method of forming a pattern according to the current embodiment. Thus, as an automatic decomposition may be performed using the trimming pattern 430, the double patterning process may be applied to a circuit pattern with a non-line-and-space shape.

Although a fine pattern having a line width less than about 40 nm is formed by applying the double patterning process using the method of forming a pattern according to an embodiment of the inventive concept, it is noted that exemplary embodiments of the inventive concept are not limited thereto. However, it is readily apparent to one of ordinary skill in the art based upon the present disclosure that the method of forming a pattern may also be applied to a pattern having a line width greater than about 40 nm.

In addition, the method of forming a pattern described above with reference to FIGS. 2 through 12 may be embodied, for example, as a computer readable code on a computer readable recording medium. For example, a pattern-forming program for determining the shapes of patterns may be stored in a recording medium in a device for forming the patterns in a reticle. The pattern-forming program may automatically form the shapes of the initial pattern 300 and the trimming pattern 430 for forming the target pattern 10 according to the method of forming a pattern described above with reference to FIGS. 2 through 12.

The computer readable recording medium is, for example, any data storage device that can store data that can thereafter be read by a computer system. Examples of the computer readable recording medium include but are not limited to read-only memory (ROM), random-access memory (RAM), CD-ROMs, magnetic tapes, floppy disks, optical data storage devices, etc., and transmission media such as Internet transmission media. The computer readable recording medium can also be distributed over, for example, network coupled computer systems so that the computer readable code may be stored and executed in a distributed fashion. Also, functional programs, codes, and code segments for accomplishing exemplary embodiments of the inventive concept can be readily construed by programmers skilled in the art to which exemplary embodiments of the inventive concept pertains.

Figure 13:
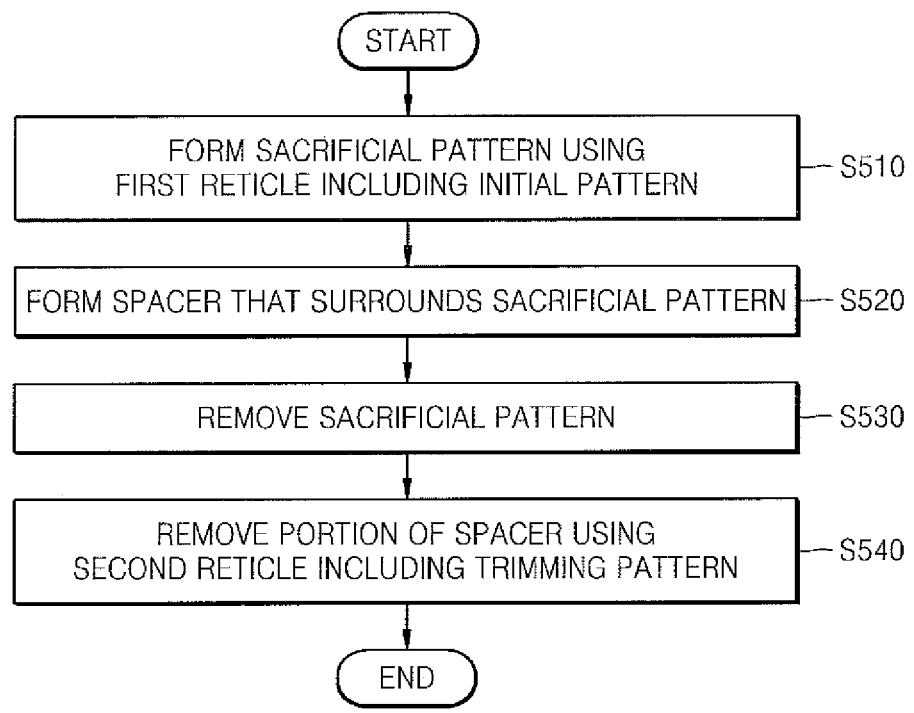
FIG. 13 is a flowchart for schematically explaining a method of forming a pattern according to an embodiment of the inventive concept.

FIG. 13 is a flowchart for schematically explaining a method of forming a pattern according to an embodiment of the inventive concept. The method of forming a pattern according to the current embodiment may be the method of FIGS. 2 through 12, that is, a method of forming a fine pattern on a semiconductor substrate using an initial pattern and a trimming pattern. Parts already described above will not be described again.

Referring to FIG. 13, a sacrificial pattern is formed on a film to be etched using, for example, a first reticle including an initial pattern (S510). The film to be etched may include, for example, any of metal, non-metal, a semiconductor material, etc.

Then, a spacer that surrounds the sacrificial pattern is formed (S520). The spacer may be formed by, for example, forming a spacer layer on the sacrificial pattern, and etching the spacer layer. In this regard, the spacer is a portion of the spacer layer remaining after the etching. After forming the spacer, the sacrificial pattern is removed (S530).

Then, a portion of the spacer that does not overlap with a target pattern is removed using, for example, a second reticle including a trimming pattern (S540). The remaining (portion of the) spacer is, for example, used as an etch mask to etch the film to be etched, thereby forming a fine pattern having the same shape as the target pattern.

FIGS. 14 through 17 are diagrams for describing a process of forming an initial pattern by using a method of forming a pattern according to an embodiment of the inventive concept.

Figure 14:
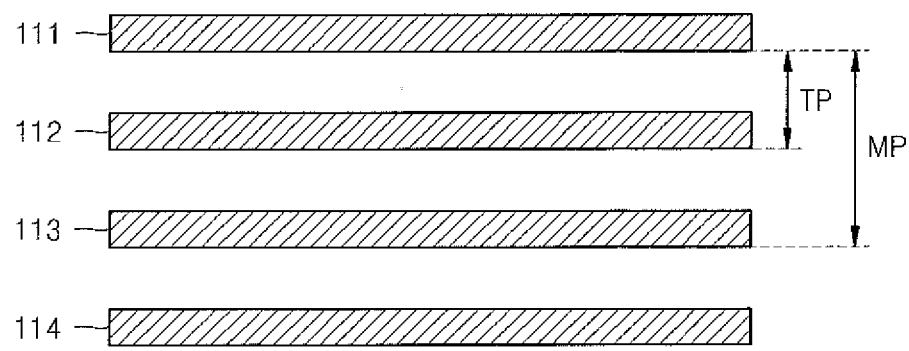
FIGS. 14 through 17 are diagrams for describing a process of fainting an initial pattern by using a method of forming a pattern according to an embodiment of the inventive concept.
Figure 15:
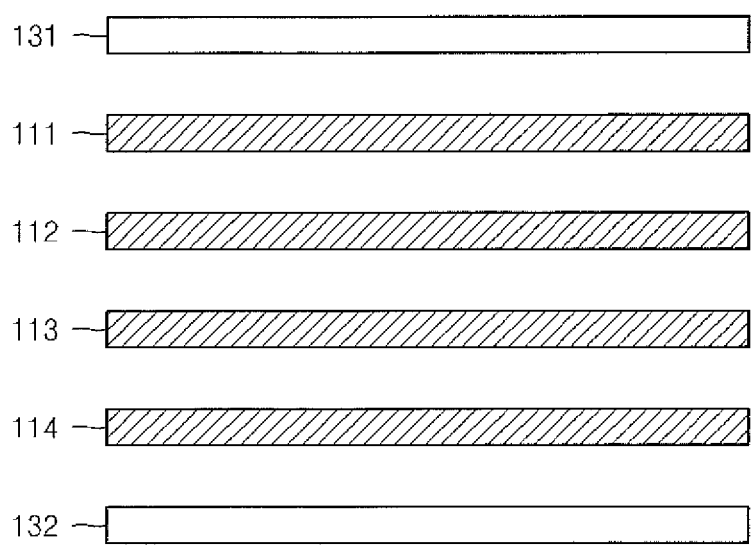

Referring to FIG. 14, a plurality of target patterns 111, 112, 113, and 114 arranged with, for example, a pitch TP less than the minimum pitch MP of the exposure apparatus are defined. Next, as illustrated in FIG. 15, dummy patterns 131 and 132 that are parallel to the plurality of target patterns 111, 112, 113, and 114 are additionally defined. In this case, the dummy patterns 131 and 132 are, for example, defined to be arranged outside the plurality of target patterns 111, 112, 113, and 114, to have the same widths as the target patterns 111, 112, 113, and 114 and to be arranged with a pitch (for example, a pitch TP) less than the minimum pitch MP of the exposure apparatus. Patterns including the target patterns 111, 112, 113, and 114 and the dummy patterns 131 and 132 are defined in FIG. 15. Optionally, an enclosure may be defined to include boundaries between the target patterns 111, 112, 113, and 114 (and the dummy patterns 131 and 132)

Next, a plurality of pitch violating patterns 1101, 1102, 1103, 1104, and 1105 are, for example, defined to contact the target patterns 111, 112, 113, and 114, and the dummy patterns 131, and 132 and to correspond to regions between the target patterns 111, 112, 113, and 114, and the dummy patterns 131, and 132. After the plurality of pitch violating patterns 1101, 1102, 1103, 1104, and 1105 are classified into a first region and a second region, one of the first region and the second region is selected. The above-described operations have been described with reference to FIGS. 3 through 8 and thus redundant description thereof will be omitted.

Figure 16:
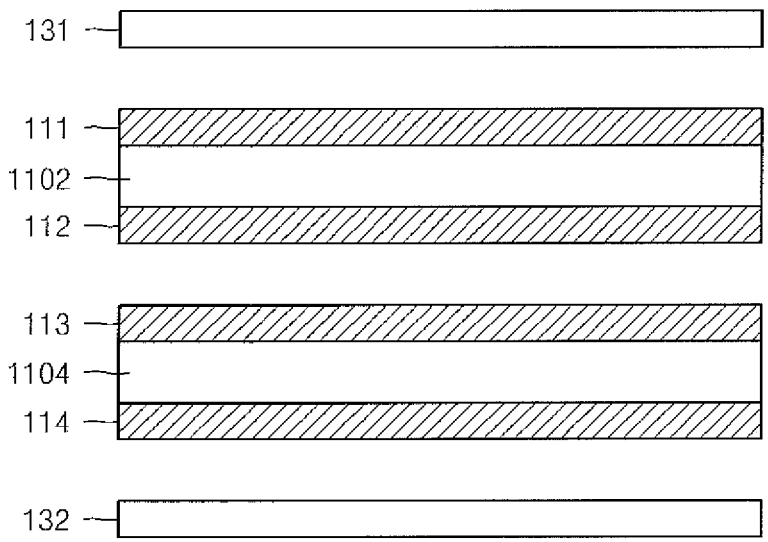
Figure 17:
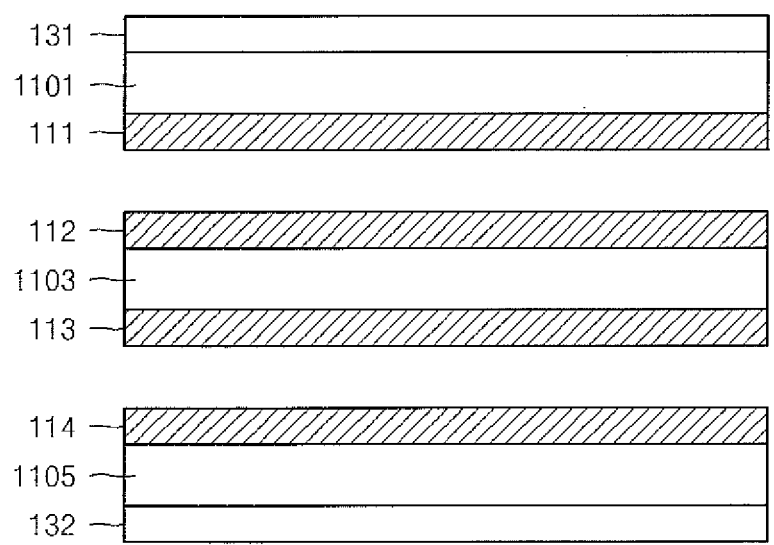

In the previous method described herein, the initial pattern is defined by selecting one of the first and second regions (see related description of FIG. 8). In this case, one of the pitch violating patterns 1102 and 1104 of FIG. 16 and the pitch violating patterns 1101, 1103, and 1105 of FIG. 17 is randomly selected and thus is defined as the initial pattern. However, according to the current embodiment, it is noted that the pitch violating patterns 1101, 1103, and 1105 of FIG. 17 instead of the pitch violating patterns 1102 and 1104 of FIG. 16 are defined the an initial pattern.

That is, in the method of forming a pattern according to exemplary embodiments of the inventive concept, a region that contacts the dummy patterns 131 and 132 is selected from the first region and the second region, and thereby forming the pitch violating patterns 1101, 1103, and 1105 corresponding to the selected region as an initial pattern of a first reticle, and a region of a side wall surrounding the pitch violating patterns that excludes a portion of the side wall which overlaps the target pattern from the side wall, is defined as a trimming pattern of a second reticle, as illustrated in FIG. 17.

Figure 18A:
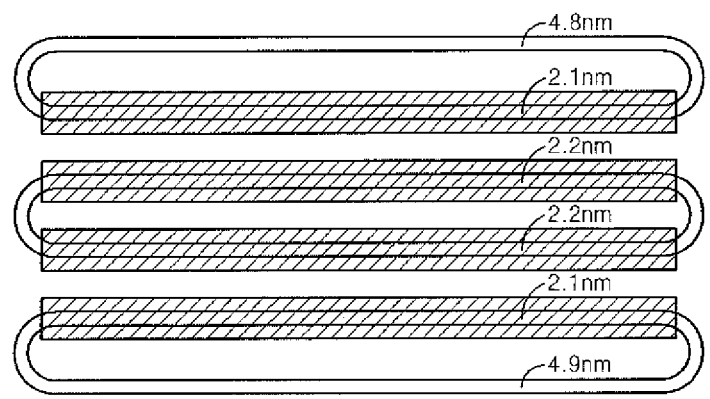
FIGS. 18A and 18B are diagrams for describing the technical effect of a method of forming a pattern according to an embodiment of the inventive concept.
Figure 18B:
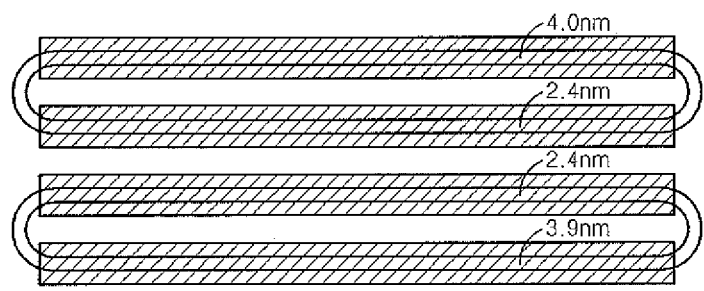

FIGS. 18A and 18B are diagrams for describing the technical effect of a method of forming a pattern according to an embodiment of the inventive concept. FIG. 18A illustrates the pitch violating patterns corresponding to the region that contacts the dummy patterns, which are formed as an initial pattern, and the distribution of side walls formed using the initial pattern. FIG. 18B illustrates the pitch violating patterns corresponding to a region that is adjacent to the region (for example, a region that does not contact the dummy patterns), which are formed as an initial pattern, and the distribution of side walls formed using the initial pattern.

Referring to FIGS. 18A and 18B, the distribution of side walls increases at the outermost part of the side walls. This phenomenon occurs because the outermost part of the side walls is more exposed to an etching material than in the other portions of the side walls as an etching process is actually performed (so-called 'etching loading' effect). In FIG. 18B, as the outermost part of the side walls correspond to the target pattern, the distribution of target patterns increases. The larger the distribution of target patterns, the more the performance of the semiconductor device is affected by the distribution. On the other hand, in FIG. 18A, as the outermost part of the side walls corresponds to the dummy patterns, the distribution of dummy patterns increases. As the dummy patterns will be removed in future, the dummy patterns do not affect the performance of the semiconductor device.

As a result, regions that contact the dummy patterns 131 and 132 are selected from regions corresponding to the pitch violating patterns 1101, 1102, 1103, 1104, and 1105, and the pitch violating patterns 1101, 1103, and 1105 that correspond to the selected regions are defined as an initial pattern as illustrated in FIG. 17, and thereby preventing the performance of the semiconductor device from being deteriorated.

FIGS. 19 through 23 are diagrams for describing a process of forming an initial pattern by using a method of forming a pattern according to an embodiment of the inventive concept.

Figure 19:
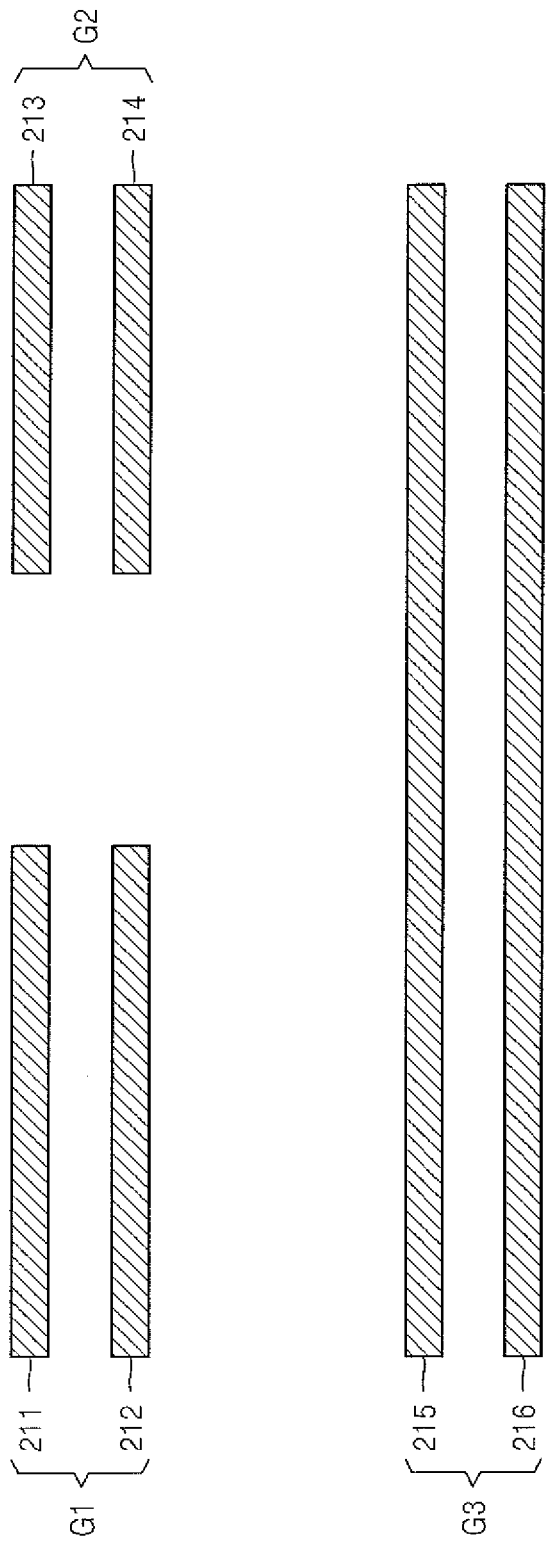
FIGS. 19 through 23 are diagrams for describing a process of forming an initial pattern by using a method of forming a pattern according to an embodiment of the inventive concept.
Figure 20:
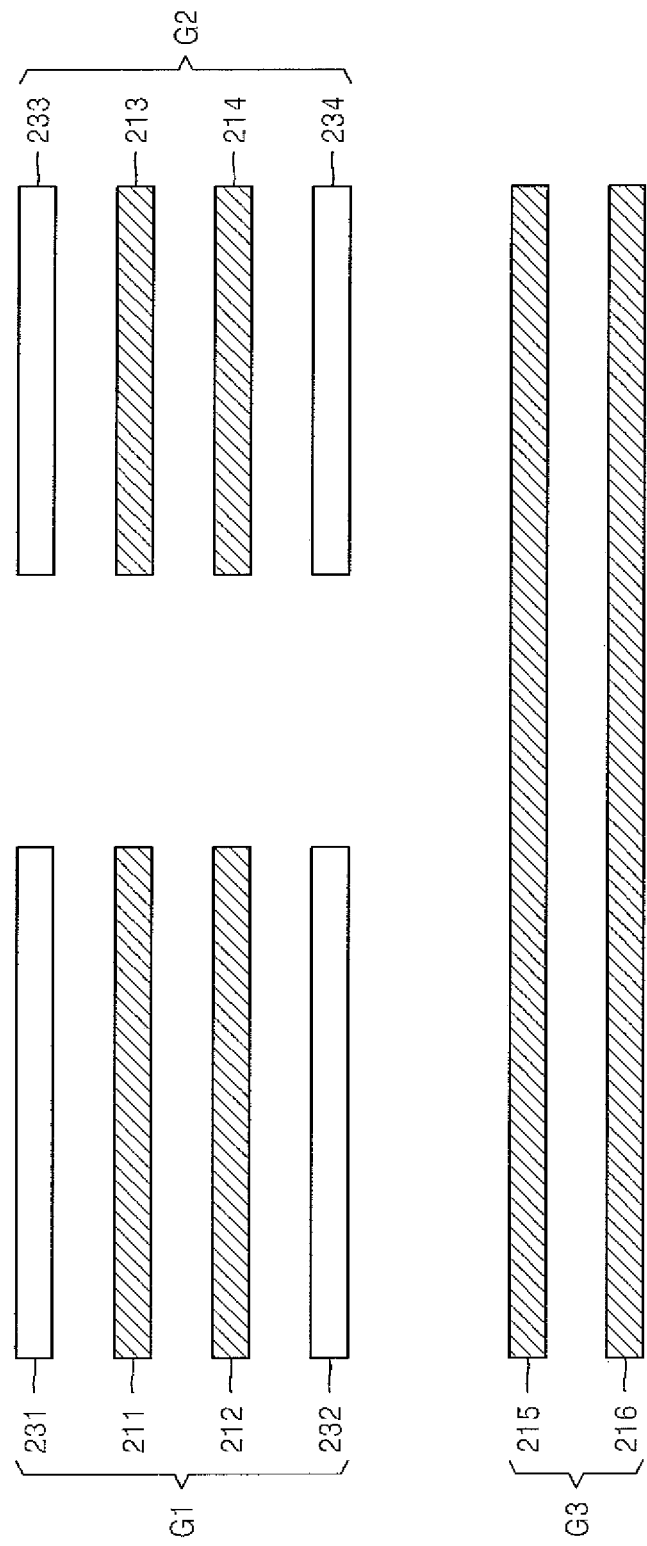

As illustrated in FIG. 19, first, target patterns 211, 212, 213, 214, 215, and 216 are defined. The target patterns 211, 212, 213, 214, 215, and 216 may be classified into a first group G1, a second group G2, and a third group G3. It is assumed that each of the first through third groups G1, G2, and G3 is distant from the minimum pitch of the exposure apparatus. Next, as illustrated in FIG. 20, the dummy patterns 231, 232, 233, and 234 are defined. In the present embodiment, it is assumed that the dummy patterns 231, 232, 233, and 234 are formed only in the first group G1 and the second group G2.

Next, a plurality of pitch violating patterns 2101, 2102, 2103, 2104, 2105, 2106, and 2107 that contact the patterns (for example, the target patterns 211, 212, 213, 214, 215, and 216 and the dummy patterns 231, 232, 233, and 234) and correspond to regions between the patterns, are defined, and after the pitch violating patterns are classified into a first region and a second region, one of the first region and the second region is selected. The selecting operation may be performed independently, such that selecting operation within each of the first through third groups G1, G2, and G3 can be performed respectively.

Figure 21:
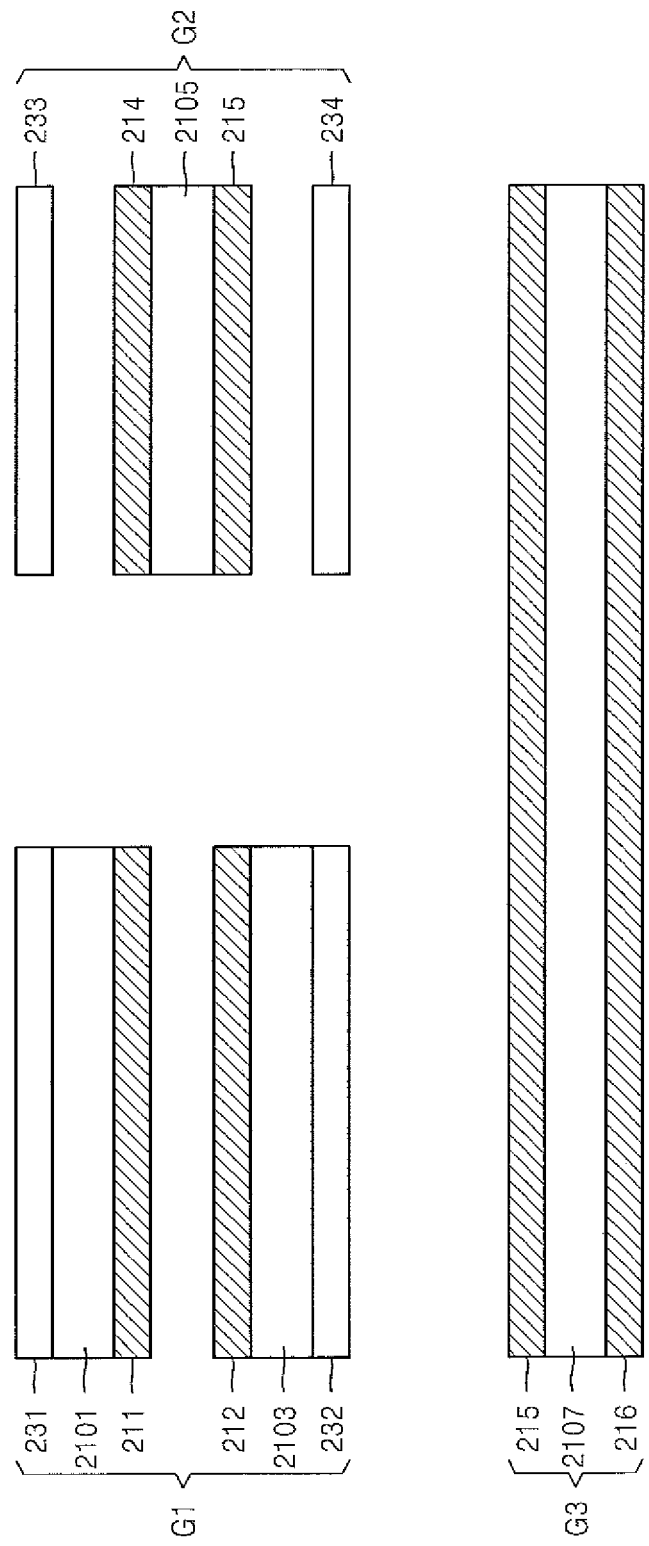

For example, as illustrated in FIG. 21, in the first group G1, the pitch violating patterns 2101 and 2103 corresponding to a region that contacts the dummy pattern 231 may be selected, and in the second group G2, the pitch violating pattern 2105 corresponding to a region that is adjacent to the region contacting the dummy pattern 232 may be selected. In addition, as illustrated in FIG. 22, in both the first group G1 and the second group G2, the pitch violating patterns 2101, 2103, 2104, and 2106 corresponding to the region that is adjacent to the region contacting the dummy patterns 231 and 232 may be selected, and as illustrated in FIG. 22, in both the first group G1 and the second group G2, the pitch violating patterns 2102 and 2105 corresponding to the region that contact the dummy patterns 231 and 232 may be selected.

In the previous method described herein, the initial pattern is defined by selecting one of the first region and the second region (see related description of FIG. 8). According to the previous method described herein, one is randomly selected from the pitch violating patterns illustrated in FIGS. 21 through 23 and is defined as an initial pattern. However, according to the current embodiment, it is noted that the pitch violating patterns 2102, 2105, and 2107 of FIG. 22 or the pitch violating patterns 2101, 2103, 2104, 2106, and 2107 of FIG. 23 is defined as the initial pattern instead of the pitch violating patterns 2101, 2103, 2105, and 2107 of FIG. 21.

Figure 22:
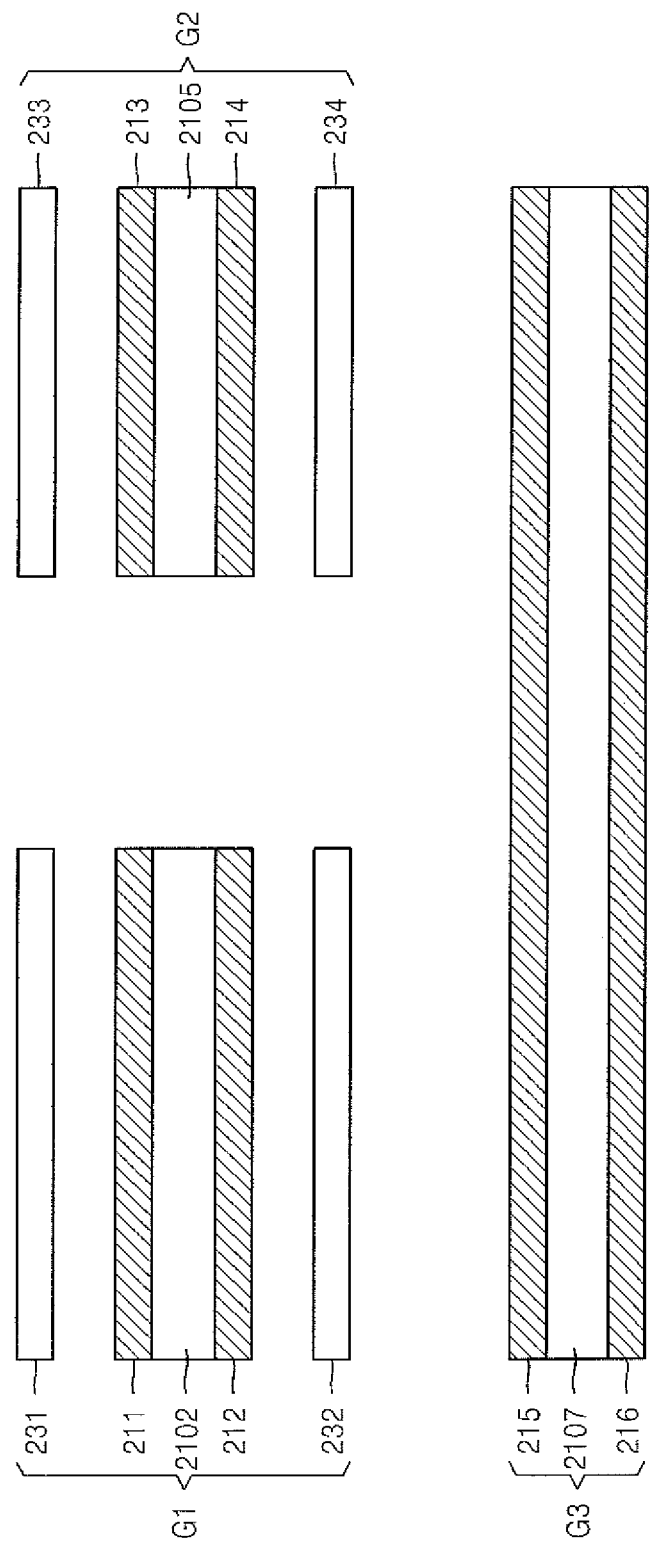
Figure 23:
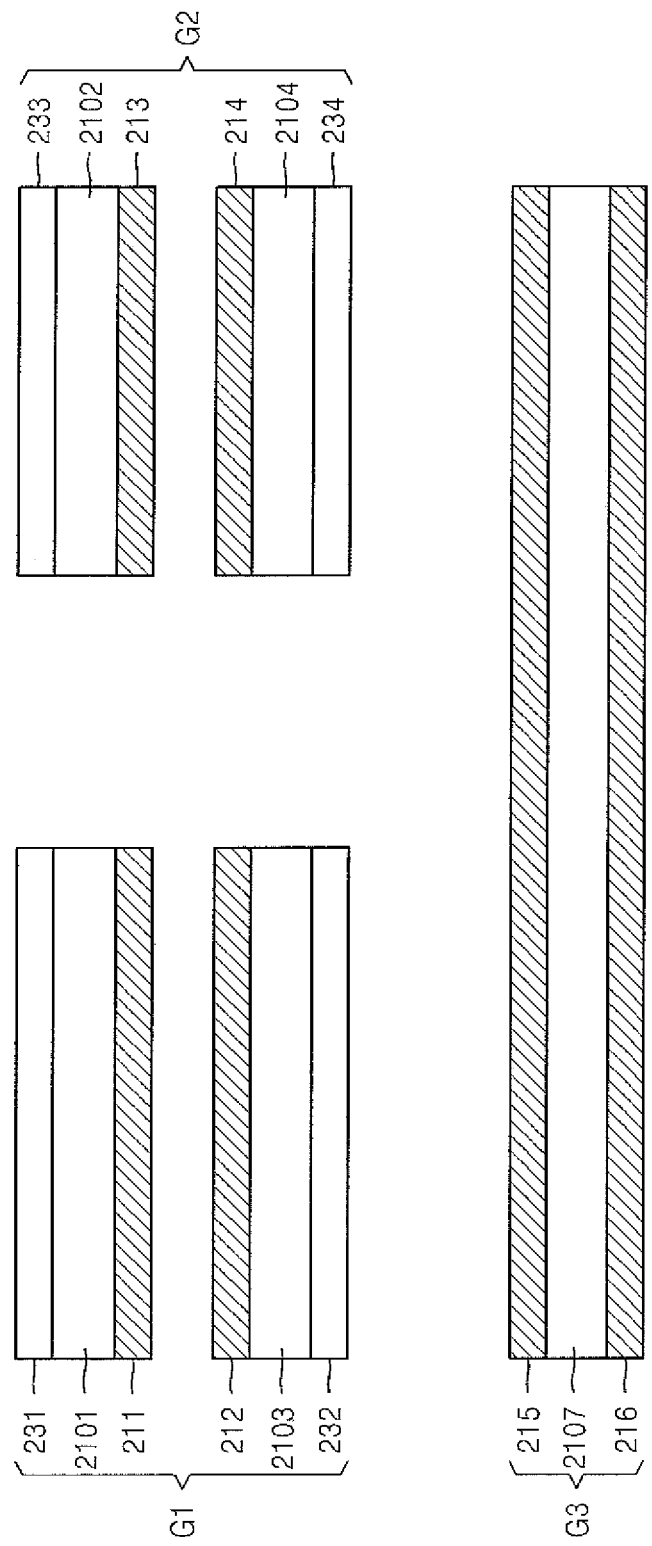

That is, in the method of forming a pattern according to exemplary embodiments of the inventive concept, the same kind region as one selected from the first and second regions is selected, and pitch violating patterns corresponding to the region is formed as an initial pattern of a first reticle, and a region of a side wall surrounding the pitch violating patterns that excludes a portion of the side wall which overlaps the target pattern from the side wall, is defined as a trimming pattern of a second reticle, as illustrated in FIG. 22 or 23.

Figure 24A:
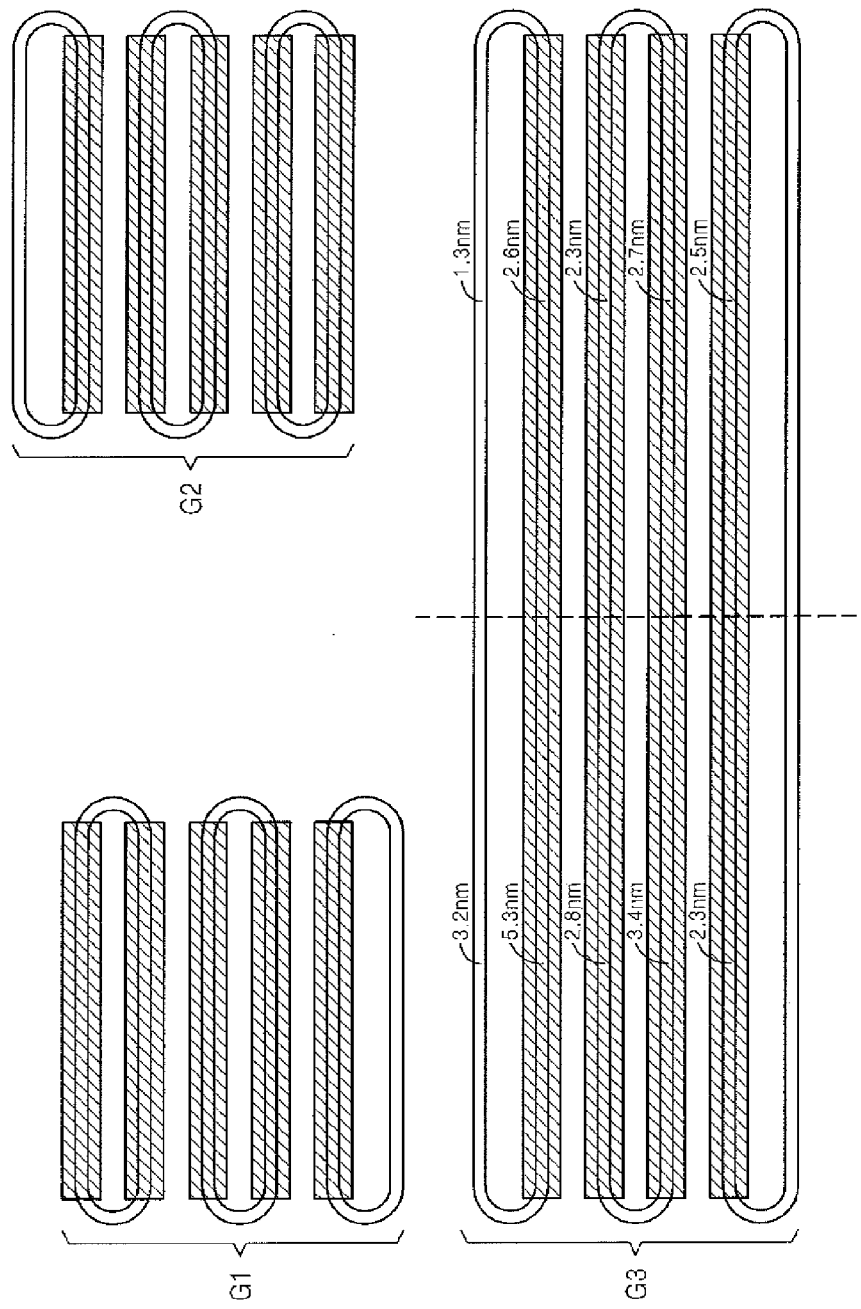

FIGS. 24A and 24B are diagrams for describing the technical effect of a method of forming a pattern according to an embodiment of the inventive concept. FIG. 24A illustrates different kinds of pitch violating patterns selected from the pitch violating patterns, which are formed as an initial pattern and the distribution of side walls formed using the initial pattern, and FIG. 24B illustrates the same kind of pitch violating patterns selected from the pitch violating patterns, which are formed as an initial pattern and the distribution of side walls formed using the initial pattern.

As illustrated in FIG. 24A, when different kinds of pitch violating patterns are selected from the pitch violating patterns, the distribution of patterns in the third group G3 increases. This phenomenon occurs because the total distribution of patterns increases due to addition of a first distribution that occurs when a first kind of pitch violating patterns (for example, pitch violating patterns in the first group G1)

are formed and a second distribution that occurs when a second kind of pitch violating patterns (for example, pitch violating patterns in the second group G2) are formed (so-called 'lithography effect'). On the other hand, in FIG. 24B, the same kind of pitch violating patterns are selected so that the distribution of patterns in the third group G3 decreases and the performance of the semiconductor device may be increased.

As a result, the same kind of regions as one selected from regions corresponding to the pitch violating patterns is selected, and the pitch violating patterns corresponding to the selected regions are defined as an initial pattern as illustrated in FIG. 24B, and thereby the performance of the semiconductor device is prevented from being deteriorated.

Furthermore, miniaturization of the semiconductor device may be achieved using a method of forming a pattern according to an exemplary embodiment of the inventive concept. For example, when the target patterns (211, 212, 213, and 214 of FIG. 21) are formed by selecting the same kind of pitch violating patterns in the same manner as FIG. 22, the dummy patterns (231 and 233 of FIG. 21) are not required to be formed. Thus, the area of a semiconductor chip area may be reduced without forming the dummy patterns.

Figure 25:
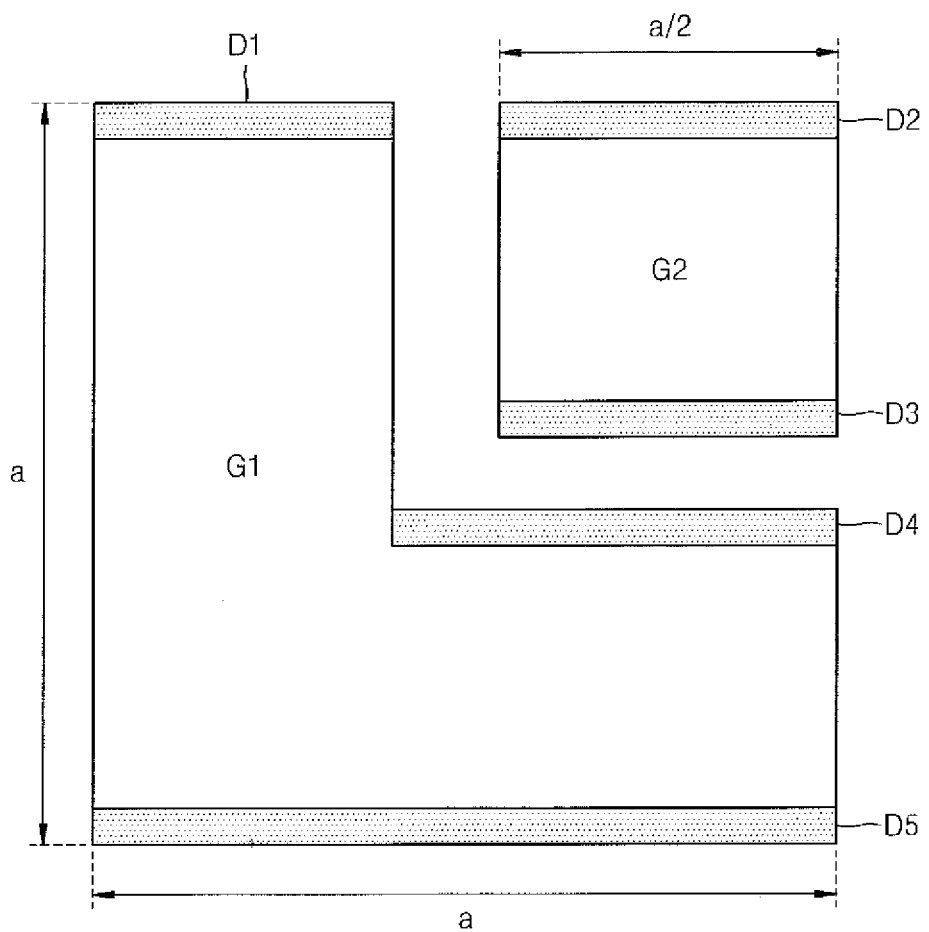
FIG. 25 is a diagram for describing a degree at which the area of a semiconductor chip implemented by using a method of forming a pattern according to an embodiment of the inventive concept is reduced.

FIG. 25 is a diagram for describing a degree at which the area of the semiconductor chip implemented by using a method of forming a pattern according to an exemplary embodiment of the inventive concept is reduced.

Referring to FIG. 25, for example, it is assumed that the semiconductor chip has a square shape with the length a of each side and target patterns are divided into a first group G1 and a second group G2. In the method of forming a pattern according to an exemplary embodiment of the inventive concept, dummy patterns D1, D2, D3, D4, and D5 will be formed.

When target patterns are formed by selecting the same kind of pitch violating patterns, such as, for example, by using pitch violating patterns that do not contact the dummy patterns, the dummy patterns are not required to be formed, as described above. In this case, the area of the semiconductor chip may be reduced by the area of the dummy patterns D1, D2, D3, D4, and D5.

Assuming that the width of the dummy pattern is x and a distance between the first group G1 and the second group G2 is small to be ignorable, an area reduction ratio (e.g., the ratio of the area of the dummy patterns with respect to the whole area) may be calculated using, for example, Equation 1.

$$\frac{D1 + D2 + D3 + D4 + D5}{\text{whole area}} = \frac{3 \times a \times x}{a^2} = \frac{3x}{a} \quad \text{[Equation 1]}$$

Area reduction may be performed according to cases where, when x×50 nm, a=1 um and a=10 um, as shown in the following Table 1.

TABLE 1

| | Area reduction ratio (%) |
|---|---|
| a = 1 um | 15 |
| a = 10 um | 1.5 |

In this way, according to an exemplary embodiment of the inventive concept, the same kind of pitch violating patterns that do not contact the dummy patterns are selected, and the dummy patterns are not formed so that the area of the semiconductor chip may be reduced.

FIGS. 26 through 29 are diagram for describing a process of forming an initial pattern by using a method of forming a pattern according to an embodiment of the inventive concept.

Figure 26:
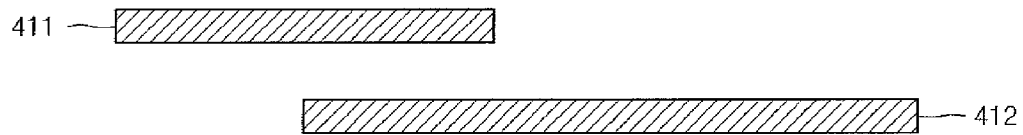
FIGS. 26 through 29 are diagram for describing a process of forming an initial pattern by using a method of forming a pattern according to an embodiment of the inventive concept.
Figure 27:
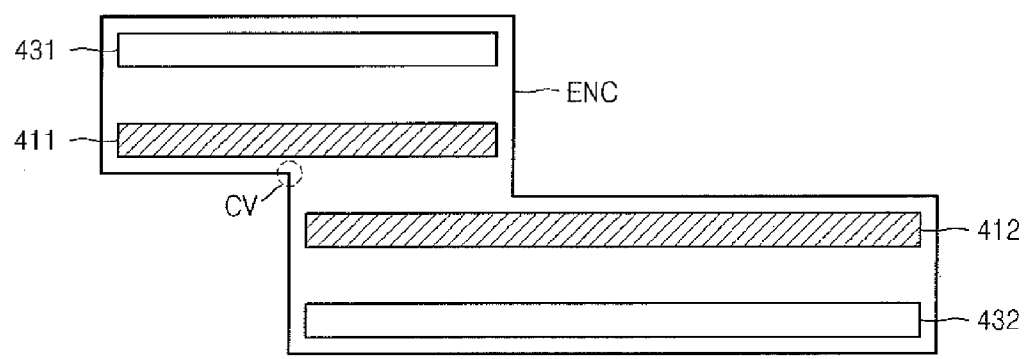

As illustrated in FIG. 26, first, target patterns 411 and 412 are defined. Next, as illustrated in FIG. 27, dummy patterns 431 and 432 are defined, and an enclosure ENC is additionally defined to include boundaries of the patterns (for example, the target patterns 411 and 412 and the dummy patterns 431 and 432.

Next, a plurality of pitch violating patterns 4101, 4102, and 4103 that contact the patterns (for example, the target patterns 411 and 412 and the dummy patterns 431 and 432) and correspond to regions between the patterns, are defined, and after the plurality of pitch violating patterns 4101, 4102, and 4103 are classified into a first region and a second region, one of the first region and the second region is selected.

Figure 28:
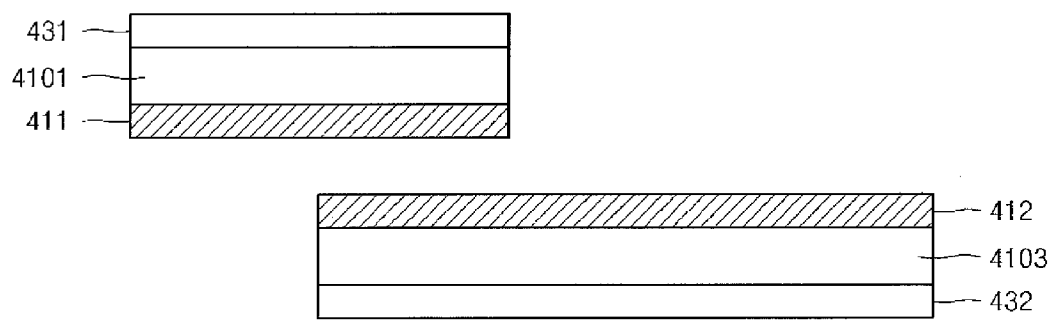

For example, as illustrated in FIG. 28, a region that does not contact a concave part CV of the enclosure ENC may be selected from the first region and the second region. In addition, as illustrated in FIG. 29, a region that contacts (for example, overlaps) the concave part CV of the enclosure ENC may be selected from the first region and the second region.

In the previous method described herein, the initial pattern is defined by selecting one of the first region and the second region (see related description of FIG. 8). According to the previous method described herein, one is randomly selected from the pitch violating patterns of FIGS. 28 through 29 and is defined as the initial pattern. However, according to the present embodiment, it is noted that the pitch violating pattern 4102 of FIG. 29 instead of the pitch violating patterns 4101 and 4103 of FIG. 28 is defined as the initial pattern.

Figure 29:
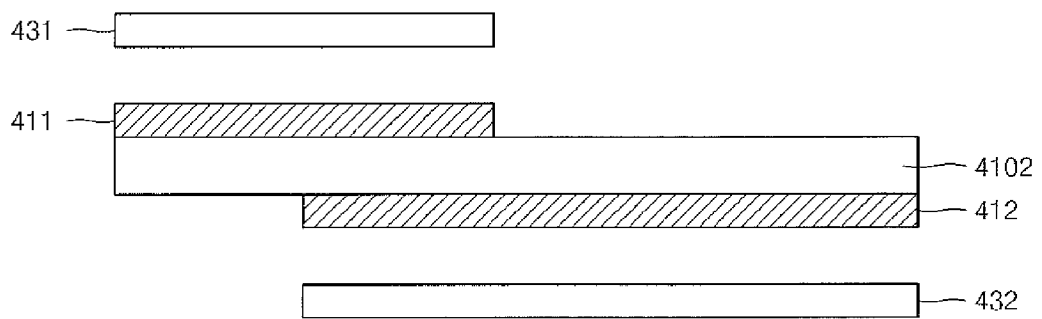

For example, in the method of forming a pattern according to exemplary embodiments of the inventive concept, the region that contacts the concave part CV of the enclosure ENC, e.g., a region between the relatively short target pattern 411 and the relatively long target pattern 412 is selected from the first region and the second region, and the pitch violating patterns 4102 corresponding to the region are formed as an initial pattern of a first reticcle, and a region of a side wall surrounding the pitch violating patterns 4102 that excludes a portion of the side wall which overlaps the target patterns 411 and 412 from the side wall, is defined as a trimming pattern of a second reticle, as illustrated in FIG. 29.

Figure 30A:
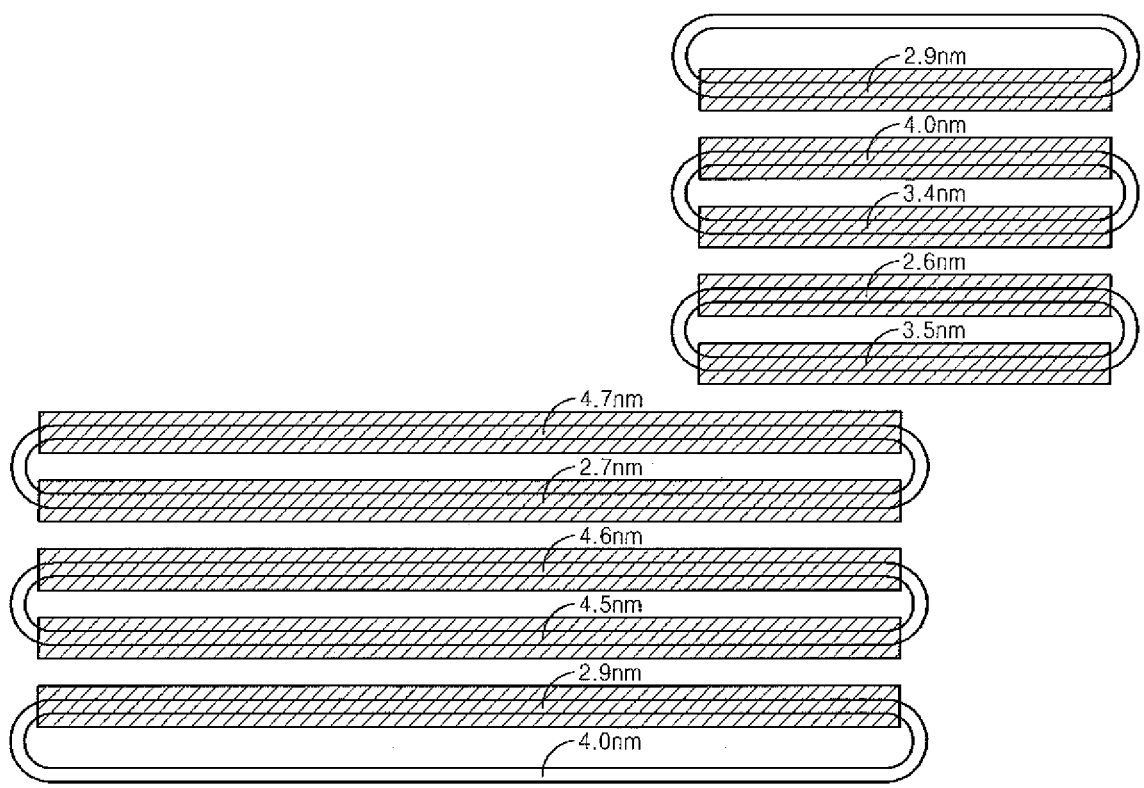
FIGS. 30A and 30B are diagrams for describing technical effects of a method of forming a pattern according to an embodiment of the inventive concept.
Figure 30B:
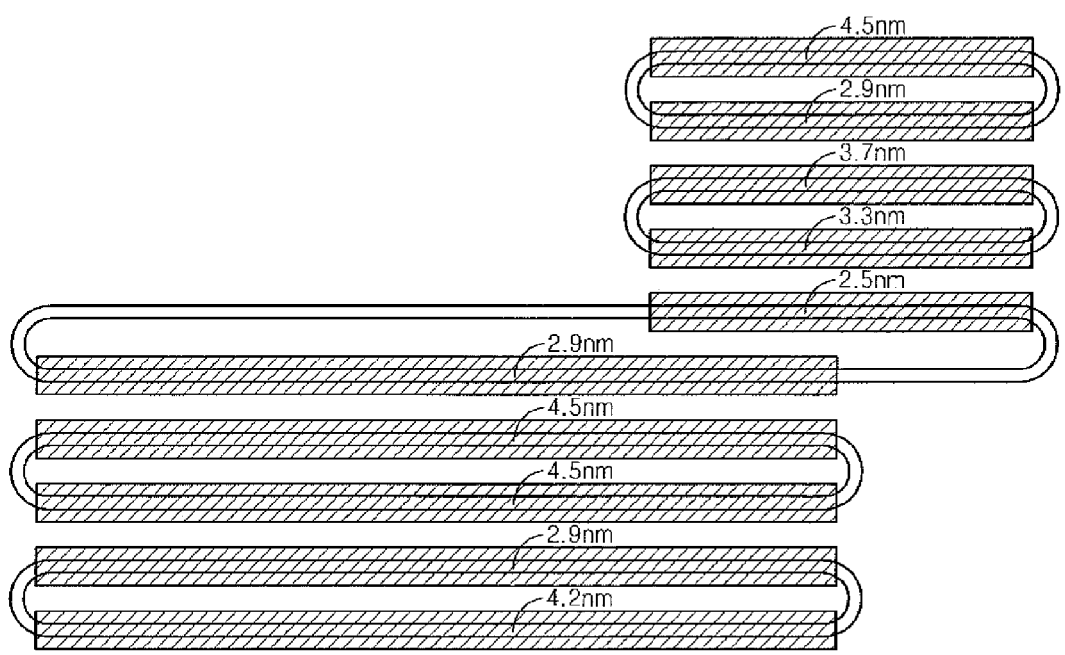

FIGS. 30A and 30B are diagrams for describing the technical effect of a method of forming a pattern according to an embodiment of the inventive concept. FIG. 30A illustrates pitch violating patterns that do not contact a concave part of an enclosure, which are formed as an initial pattern and the distribution of side walls formed using the initial pattern.

As illustrated in FIG. 30A, when the pitch violating patterns that do not contact the concave part of the enclosure are selected, the distribution of relatively short target patterns and relatively long target patterns increase. This phenomenon occurs because a side wall surrounding pitch violating patterns for forming the relatively short target patterns and a side wall surrounding pitch violating patterns for forming the relatively long target patterns have, for example, an oval shape and each of the relatively short target patterns and the relatively long target patterns is formed as a side wall having two bent parts so that the distribution increases due to the two bent parts. On the other hand, in FIG. 30B, pitch violating patterns between relatively short target patterns and relatively long target patterns are selected, and the relatively short target patterns and the relatively long target patterns are formed due to a side wall that surrounds the pitch violating patterns. Thus, as each of the relatively short target patterns and the relatively long target patterns is formed as a side wall having one bent part, the distribution decreases and the performance of the semiconductor device may be increased.

As a result, regions between the relatively short target patterns and the relatively long target patterns, e.g., regions that contact the concave part of the enclosure is selected from the pitch violating patterns, and the pitch violating patterns corresponding to the selected regions are defined as an initial pattern as illustrated in FIG. 30B and thereby, the performance of the semiconductor device is prevented from being deteriorated due to the distribution.

Figure 31:
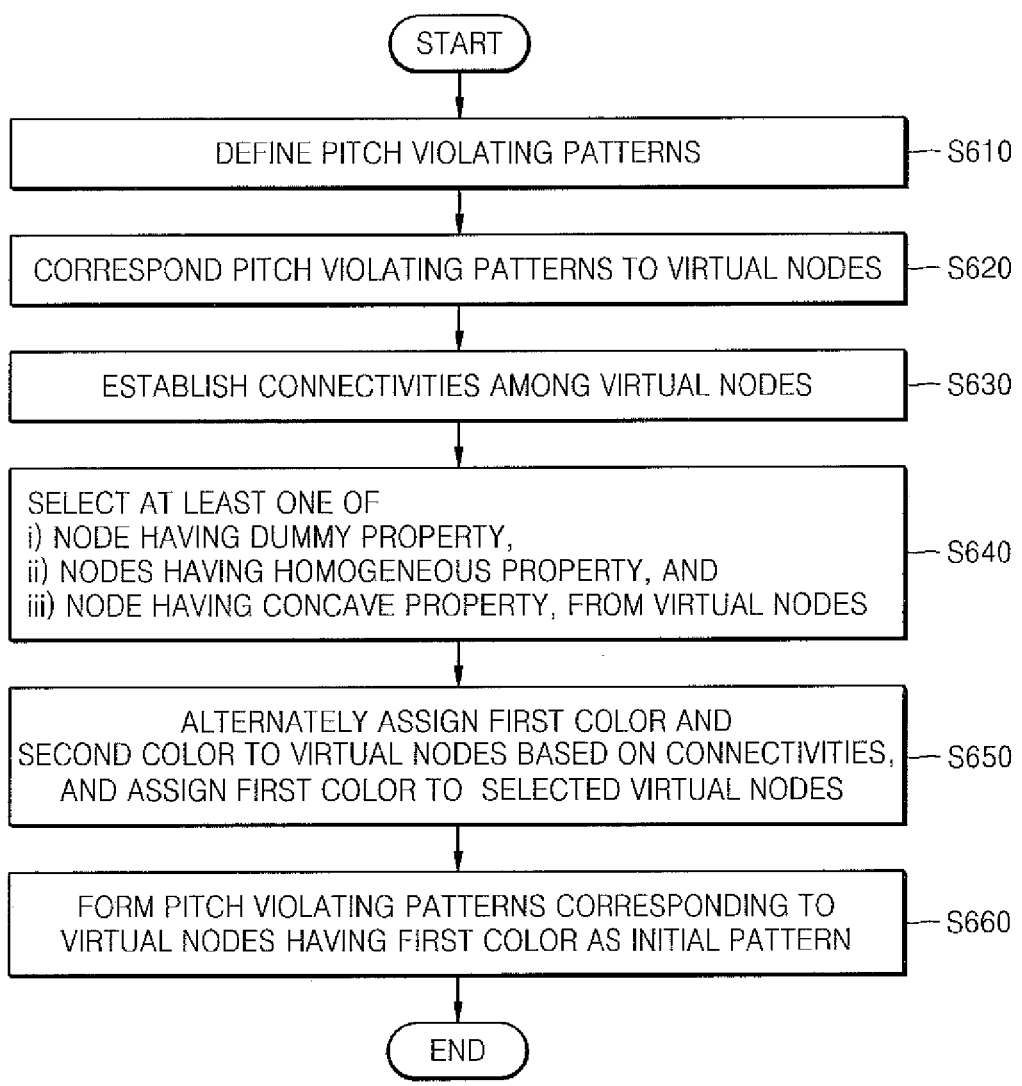
FIG. 31 is a flowchart for schematically explaining a method of forming a pattern according to an embodiment of the inventive concept.

FIG. 31 is a flowchart for schematically explaining a method of forming a pattern according to an embodiment of the inventive concept.

Referring to FIG. 31, first, pitch violating patterns are defined (S610). As described above, the pitch violating patterns may contact patterns including target patterns and/or dummy patterns and may correspond to a region between the patterns. Next, the pitch violating patterns are arranged to correspond to virtual nodes (S620), and connectivities are established in the virtual nodes (S630). The above operations have been already described with reference to FIGS. 4 and 5 in detail and thus redundant description thereof will be omitted.

Next, for example at least one of i) a node having a dummy property, ii) nodes having a homogeneous property, and iii) a node having a concave property is selected from the virtual nodes (S640). To this end, i) an operation of searching for nodes having a dummy property from the virtual nodes, ii) an operation of searching for nodes having the same property as one node from the virtual nodes, and/or iii) operation of searching for a node having a concave property from the virtual nodes may be performed.

Next, a first color and a second color are alternately assigned to the virtual nodes based on the connectivities, and the first color is assigned to the selected virtual nodes (S650). Next, pitch violating patterns corresponding to the virtual nodes having the first color are formed as an initial pattern (S660). Thus, the initial pattern may include, for example, at least one of i) pitch violating patterns corresponding to nodes located at the outermost part of the virtual nodes, ii) pitch violating patterns corresponding to nodes having the same property, and iii) pitch violating patterns corresponding to nodes having the concave property. Thus, an initial pattern including at least one of i) pitch violating patterns that contact the dummy patterns, ii) the same kind of pitch violating patterns, and iii) pitch violating patterns that contact a concave part of an enclosure may be obtained.

Figure 32:
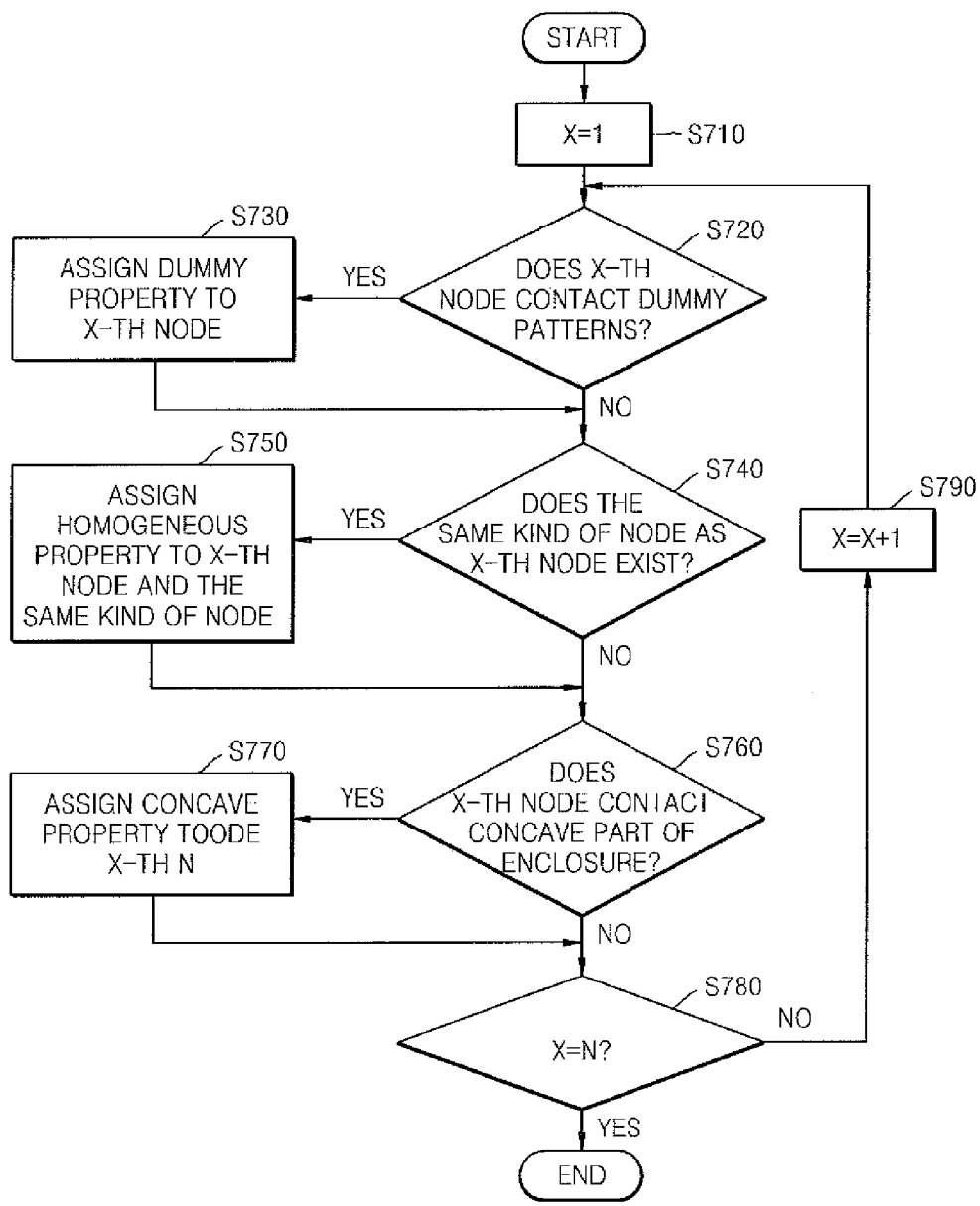
FIG. 32 is a flowchart for schematically explaining an operation of establishing a dummy property, a homogeneous property, and a concave property to virtual nodes.

FIG. 32 is a flowchart for schematically explaining an operation of establishing a dummy property, a homogeneous property, and a concave property to virtual nodes.

First, it is defined as X=1 (S710), and it is determined whether an X-th node contacts dummy patterns (S720). The contact may be determined by, for example, determining whether a boundary of the pitch violating patterns corresponding to the nodes overlaps a boundary of the dummy patterns. If the X-th node contacts the dummy patterns, the dummy property is assigned to the X-th node (S730).

Next, it is searched for whether the same kind of node as the X-th node exists (S740). If the same kind of node as the X-th node exists, a homogeneous property is assigned to the X-th node and the searched-for same kind of node (S750).

In addition, it is searched for whether the X-th node contacts a concave part of an enclosure (S760). The contact may be determined by, for example, determining whether the boundary between the pitch violating patterns corresponding to the nodes overlaps the concave part of the enclosure (S770). For example, the concave part may be defined as a corner part having an angle of about 270° formed inside the enclosure, which is selected from corner parts that form an angle of about 90° of a boundary of the enclosure. If the X-th node contacts the concave part, the concave property is assigned to the X-th node.

Next, these operations are repeatedly performed until property assignment to the whole nodes is completed.

Although, in the above-described embodiments (for example, FIGS. 14 through 18B, FIGS. 19 through 24B, and FIGS. 26 through 30B), one of i) a node having a dummy property, ii) nodes having the same property, and iii) a node having a concave property is selected from the virtual node and pitch violating patterns corresponding to the selected virtual nodes are selected so as to form an initial pattern, exemplary embodiments of the inventive concept are not limited thereto. In the method of forming a pattern according to the inventive concept, pitch violating patterns corresponding to two or three from i) to iii) nodes may be selected so as to form an initial pattern, or weights may be assigned to the nodes so as to form the initial pattern according to the weights.

FIGS. 33 through 37 are diagrams for describing an operation of assigning weights to nodes and of determining an initial pattern according to the weights.

Figure 33:
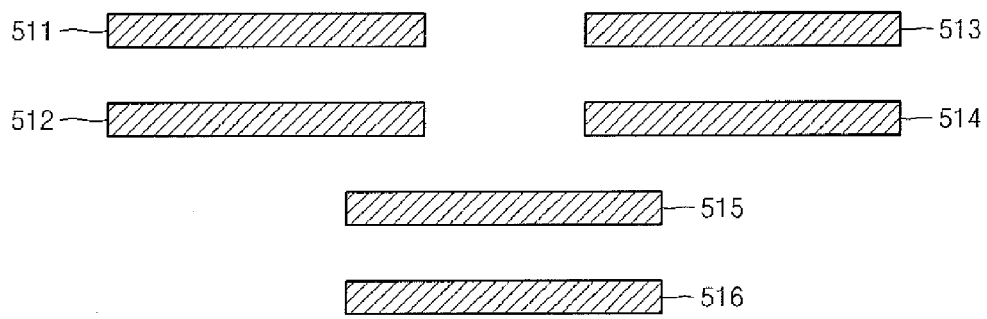
FIGS. 33 through 37 are diagrams for describing an operation of assigning weights to nodes and of determining an initial pattern according to the weights.
Figure 34:
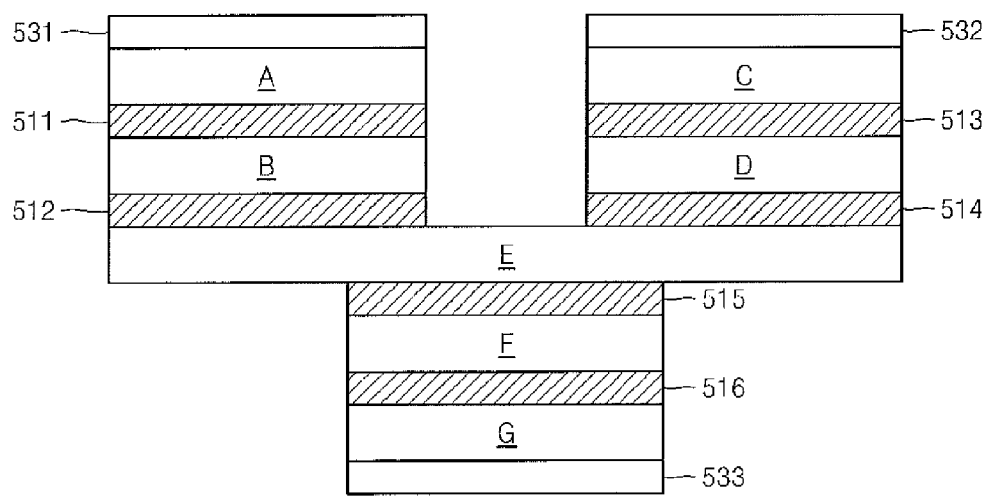

As illustrated in FIG. 33, first, target patterns 511, 512, 513, 514, 515, and 516 are defined. Next, as illustrated in FIG. 34, dummy patterns 531, 532, and 533 are defined, and a plurality of pitch violating patterns that contact patterns (for example, the target patterns 511, 512, 513, 514, 515, and 516 and the dummy patterns 531, 532, and 533) and correspond to regions between the patterns are defined. In addition, the plurality of pitch violating patterns respectively correspond to a plurality of virtual nodes A, B, C, D, E, F, and G. Although not shown, an enclosure may be defined to include boundaries of the patterns (for example, the target patterns 511, 512, 513, 514, 515, and 516 and the dummy patterns 531, 532, and 533), as described above.

Figures 35, 36:
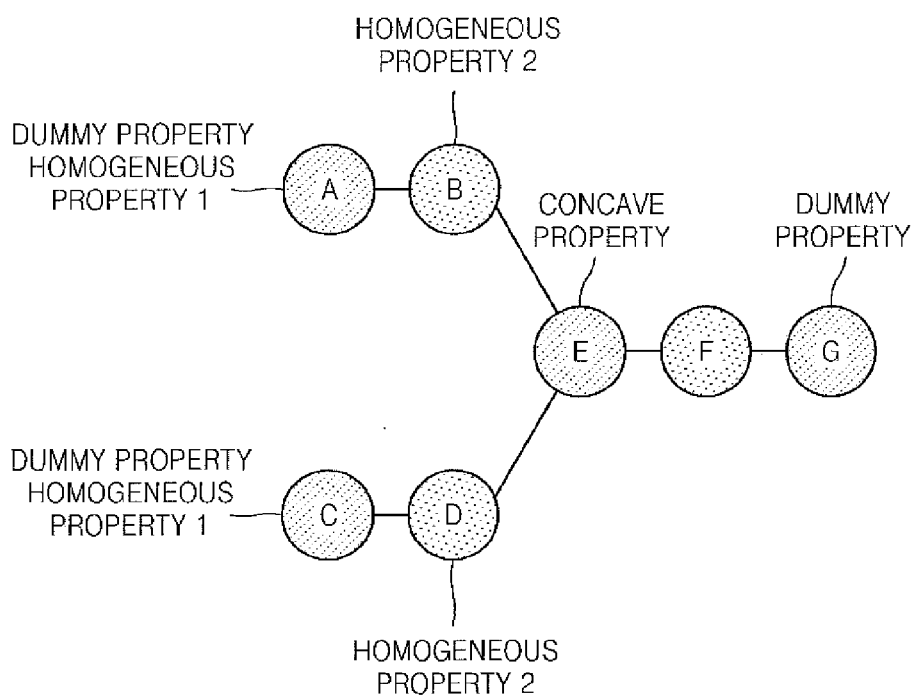

FIG. 35 illustrates connectivities assigned to the plurality of virtual nodes A, B, C, D, E, F, and G. A dummy property, a homogeneous property, and/or a concave property may be assigned to the virtual nodes A, B, C, D, E, F, and G. For example, as a result of assigning properties to the virtual nodes by using FIG. 32, nodes having the dummy property may be nodes A, C, and G, and nodes having the homogeneous property may be nodes (A,C) and (B,D), and a node having a concave property may be a node E (see FIGS. 34 and 35).

Next, a first color and a second color are alternately assigned to the virtual nodes. Thus, the virtual nodes may be classified into two sets. In this case, a first set having the first color includes, for example, the virtual nodes A, C, E, and G, and a second set having the second color includes, for example, the virtual nodes B, D, and F.

The same weights of, for example, 5 scores may be assigned to the dummy property, the homogeneous property, and the concave property (it should be noted that these weights may be adjustable). For example, in this case, in the nodes A, C, E, and G to which the first color is assigned, 15 scores are assigned to the nodes A, C, and G to which the dummy property is assigned, and 10 scores are assigned to the nodes A and C to which the homogeneous property is assigned, and 5 scores are assigned to the node E to which the concave property is assigned, so that total weights of 30 scores may be obtained. For example, in the nodes B, D, and F to which the second color is assigned, 10 scores are assigned to the nodes B and D to which the homogeneous property is assigned, so that total weights of 10 scores may be obtained.

Figure 37:
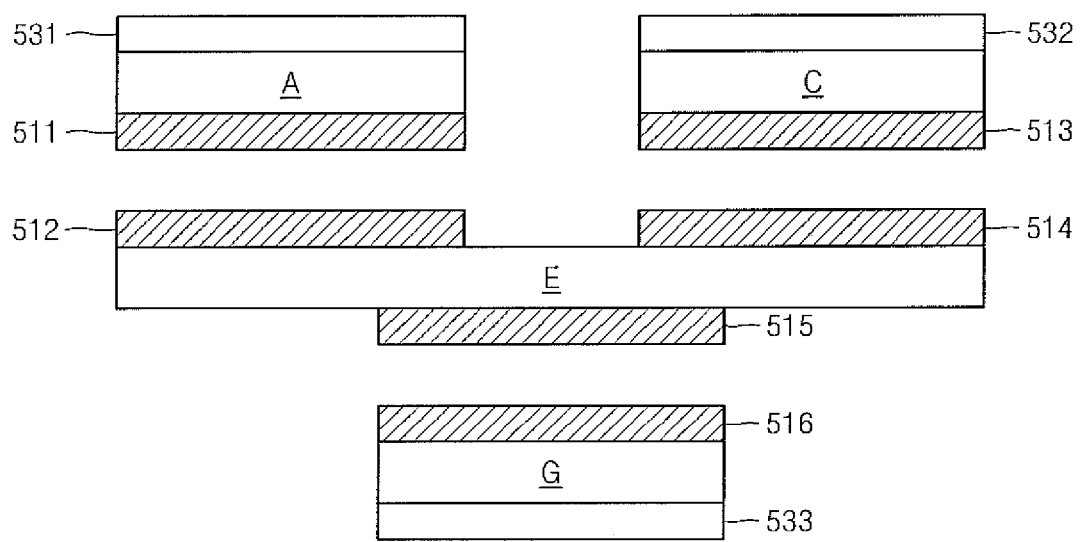

By comparing these weights, one of the first set and the second set may be selected. In the present embodiment, the first set having, for example, a weight of 30 scores may be selected. That is, as illustrated in FIG. 37, a pattern may be formed using, for example, a first reticle including an initial pattern including pitch violating patterns corresponding to the nodes A, C, E, and G so that the distribution of patterns and the performance of the semiconductor device may be increased.

Figure 38:
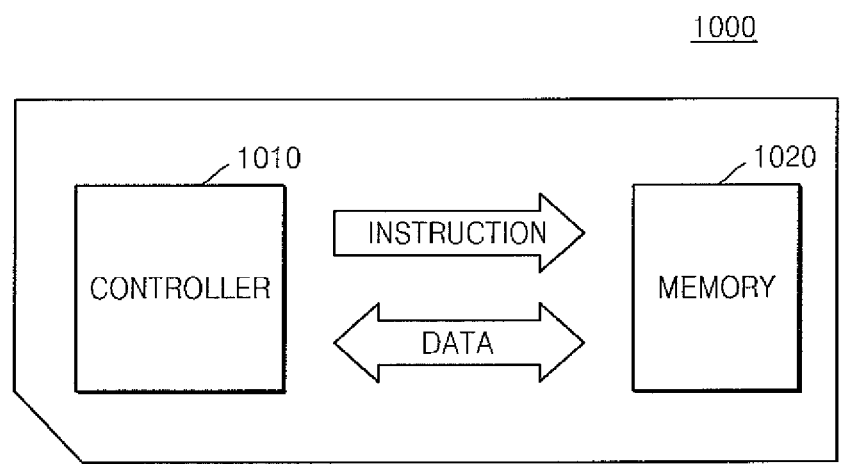
FIG. 38 is a schematic block diagram illustrating a card including a semiconductor device formed by using a method of forming a pattern according to an embodiment of the inventive concept.

FIG. 38 is a schematic block diagram illustrating a card 1000 including a semiconductor device formed by using a method of forming a pattern according to an embodiment of the inventive concept.

Referring to FIG. 38, a controller 1010 and a memory 1020 may be arranged to exchange an electrical signal. For example, when the controller 1010 provides an instruction, the memory 1020 may transmit data. The memory 1020 may include, for example, a semiconductor device fabricated according to any one of the methods of fabricating a semiconductor device according to embodiments of the inventive concept described above. As would be readily understood by one of ordinary skill in the art based upon the present disclosure, the semiconductor device may be arranged as a "NAND" and "NOR" architecture memory array (not shown) in correspondence to the design of a corresponding logic. Memory arrays arranged in a plurality of columns and rows may form one or more memory array banks (not shown). The memory 1020 may include, for example, such a memory array (not shown) or a memory array bank (not shown). In addition, the card 1000 may further include, for example, a general column decoder (not shown), a row decoder (not shown), an input/output (I/O) buffer (not shown), and/or a control register (not shown) to drive the memory array bank (not shown). The card 1000 may be embodied in any of various types of card-type memory devices, such as, for example, a memory stick card, a smart media card (SM), a secure digital (SD), a mini secure digital card (mini SD), or a multi media card (MMC).

Figure 39:
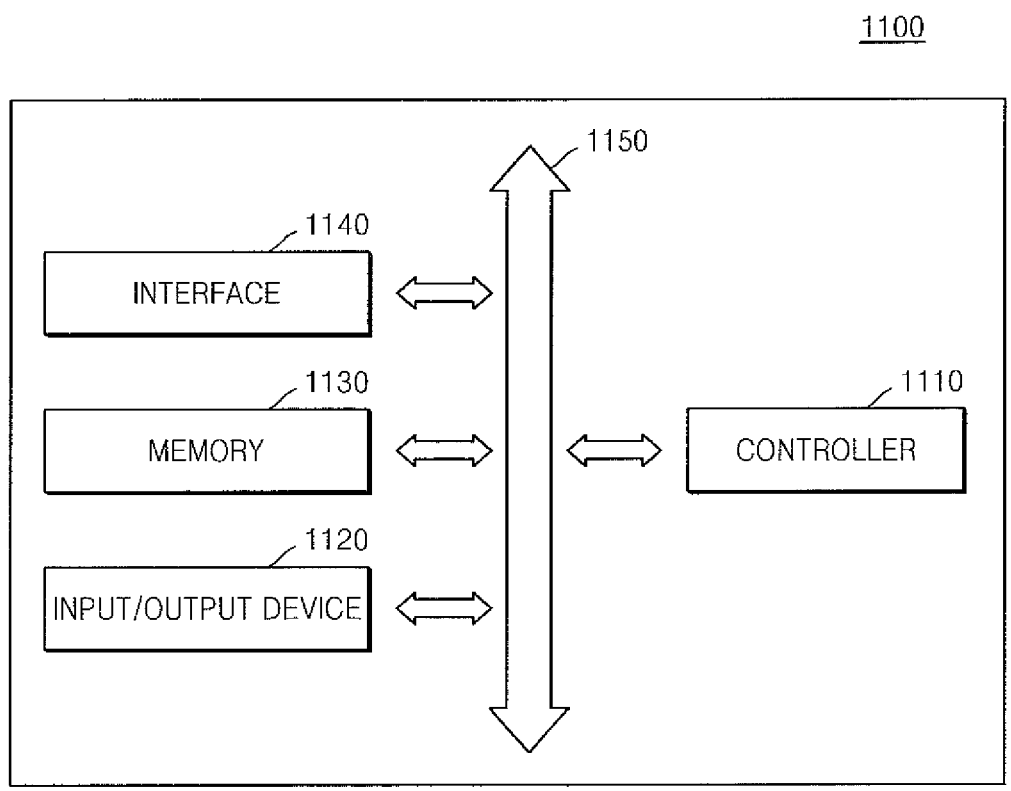
FIG. 39 is a schematic block diagram illustrating a system including a semiconductor system formed by using a method of forming a pattern according to an embodiment of the inventive concept.

FIG. 39 is a schematic block diagram illustrating a system 1100 including a semiconductor device formed by using a method of forming a pattern according to an embodiment of the inventive concept.

Referring to FIG. 39, the system 1100 may include, for example, a controller 1110, an input/output device 1120, a memory 1130, and an interface 1140. The system 1100 may be, for example, a mobile system or a system for transmitting or receiving data. Examples of the mobile system may include but are not limited to a personal digital assistant (PDA), a portable computer, a web tablet, a wireless phone, a mobile phone, a digital music player, and a memory card. The controller 1110 may launch programs and control the system 1100. The controller 1110 may be, for example, a microprocessor, a digital signal processor, a microcontroller, or the like. The input/output device 1120 may be used to input or output data from the system 1100. The system 1100 may be connected to an external device, e.g., a personal computer or a network, via the input/output device 1120, to exchange data with the external device. The input/output device 1120 may be, for example, a keypad, a keyboard, or a display. The memory 1130 may store codes and data for operating the controller 1110 and/or may store data processed by the controller 1110. The memory 1130 may include, for example, a semiconductor device fabricated according to any one of the methods of fabricating a semiconductor device according to embodiments of the inventive concept. The interface 1140 may be, for example, a data transmission path between the system 1100 and an external device. The controller 1110, the input/output device 1120, the memory 1130, and the interface 1140 may communicate each other via, for example, a bus 1150. For example, the system 1100 may be used in a mobile phone, an MP3 player, a navigation device, a portable multimedia player (PMP), a solid state disk (SSD), or a household appliance.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A method of forming a pattern, the method comprising:
defining a plurality of patterns for exposure using an exposure apparatus, the exposure apparatus having a predetermined minimum pitch;
defining a plurality of pitch violating patterns that contact the plurality of patterns and correspond to regions between the patterns that are smaller than the predetermined minimum pitch of the exposure apparatus;
classifying the plurality of pitch violating patterns into a first region and a second region by assigning proximate pitch violating patterns to different regions of the first and second region such that, when looking at the individual regions, neither the first region nor the second region includes patterns that are closer to each other than the predetermined minimum pitch;
selecting one of the first region and the second region; and
forming an initial pattern defined as the selected first or second region,
wherein the selecting comprises performing at least one of i) selecting a region that contacts dummy patterns, ii) selecting a region of a same kind as one region, and iii) selecting a region that contacts a concave part of an enclosure from the first region and the second region.

2. The method of claim 1, wherein the classifying of the plurality of pitch violating patterns into the first region and the second region comprises corresponding the plurality of pitch violating patterns to a plurality of virtual nodes.

3. The method of claim 2, wherein the i) selecting a region that contacts dummy patterns comprises searching for nodes having a dummy property from the virtual nodes.

4. The method of claim 2, wherein the ii) selecting a region of the same kind as one region comprises searching for nodes having a same property from the virtual nodes.

5. The method of claim 2, wherein the iii) selecting a region that contacts a concave part of an enclosure from the first region and the second region comprises searching for nodes having a concave property from the virtual nodes.

6. The method of claim 2, wherein the initial pattern comprises pitch violating patterns corresponding to nodes located at an outermost part of the virtual nodes.

7. The method of claim 2, wherein the initial pattern comprises pitch violating patterns corresponding to nodes having a same property.

8. The method of claim 2, wherein the initial pattern comprises pitch violating patterns corresponding to nodes having a concave property.

9. The method of claim 2, wherein the classifying of the plurality of pitch violating patterns into the first region and the second region comprises:
wherein if an interval between the plurality of pitch violating patterns is less than a minimum pitch of an exposure apparatus, establishing connectivities in the virtual nodes corresponding to the pitch violating patterns;

alternately assigning a first color and a second color to the virtual nodes based on the connectivities; and classifying pitch violating patterns corresponding to the virtual nodes having the first color into the first region and pitch violating patterns corresponding to the virtual nodes having the second color into the second region.

10. The method of claim 1, wherein the plurality of patterns comprise a plurality of target patterns and the dummy patterns, and wherein the dummy patterns comprise patterns disposed outside the plurality of target patterns.

11. The method of claim 1, wherein the enclosure comprises boundaries of the plurality of patterns.

12. A method of forming a pattern, the method comprising:

defining a plurality of patterns for exposure using an exposure apparatus, the exposure apparatus having a predetermined minimum pitch;

defining a plurality of pitch violating patterns that contact the plurality of patterns and correspond to regions between the patterns that are smaller than the predetermined minimum pitch of the exposure apparatus;

corresponding the plurality of pitch violating patterns to a plurality of virtual nodes;

wherein if an interval between the plurality of pitch violating patterns is less than a minimum pitch of an exposure apparatus, establishing connectivities in the plurality of virtual nodes corresponding to the pitch violating patterns;

selecting at least one of i) nodes having a dummy property, ii) nodes having a same property, and iii) nodes having a concave property from the virtual nodes;

alternately assigning a first color and a second color to the virtual nodes based on the connectivities and assigning the first color to the selected virtual nodes; and forming pitch violating patterns corresponding to the virtual nodes having the first color as an initial pattern.

13. The method of claim 12, wherein the initial pattern comprises at least one of i) pitch violating patterns corresponding to nodes located at an outermost part of the virtual nodes, ii) pitch violating patterns corresponding to nodes having a same property, and iii) pitch violating patterns corresponding to nodes having a concave property.

14. The method of claim 12, further comprising:

forming a sacrificial pattern on a semiconductor substrate by using a first reticle comprising the initial pattern;

forming a spacer that surrounds the sacrificial pattern;

removing the sacrificial pattern; and removing a portion of the spacer by using a second reticle.

15. The method of claim 14, wherein the second reticle comprises a trimming pattern defined as a region of a side wall surrounding the pitch violating patterns, wherein the region excludes a portion of the side wall which overlaps the target pattern.

16. A method for forming a pattern, comprising:

forming a sacrificial pattern on a film using a first reticle including an initial pattern, the first retical being a mask for exposure using an exposure apparatus, the exposure apparatus having a predetermined minimum pitch, wherein the initial pattern includes a target pattern have a plurality of patterns, a plurality of pitch violating patterns that contact the plurality of patterns of the target pattern and correspond to areas between the patterns of the target pattern that are smaller than the predetermined minimum pitch of the exposure apparatus, and a plurality of nodes corresponding to the plurality of pitch violating patterns in a first region of the initial pattern, respectively, a dummy pattern contacting at least one of the pitch violating patterns, and a protrusion protruding from a portion of the target pattern in the first region;

forming a spacer that surrounds the sacrificial pattern;

removing the sacrificial pattern;

removing a portion of the spacer that does not overlap with the target pattern by an exposure process using a second reticle including a trimming pattern, wherein the trimming pattern of the second reticle includes a first portion overlapping the target pattern and a second portion which does not overlap with the target pattern; and etching the film using a remaining portion of the spacer as an etch mask, thereby forming a fine pattern having substantially a same shape as the target pattern.

17. The method of claim 16, wherein the trimming pattern further includes a correction unit which does not overlap with the target pattern.

18. The method of claim 17, wherein the correction unit is formed using one of a design rule check (DRC) or an optical proximity correction (OPC) technique.

19. The method of claim 16, wherein the trimming pattern surrounds the initial pattern.

20. The method of claim 16, wherein the protrusion includes a first protrusion and a second protrusion, wherein the target pattern extends in a first direction and a second direction perpendicular to the first direction, wherein the first protrusion protrudes in the second direction by a minimum bar size, and the second protrusion protrudes in the first direction perpendicular to the second direction by the minimum bar size, and wherein the first protrusion and the second protrusion are connected to each other by a corner of the initial pattern.

* * * * *